(12) United States Patent
Kim et al.

(10) Patent No.: US 12,509,588 B2
(45) Date of Patent: Dec. 30, 2025

(54) CORE-SHELL COMPOUND, PHOTOSENSITIVE RESIN COMPOSITION INCLUDING THE SAME, PHOTOSENSITIVE RESIN LAYER, COLOR FILTER, AND CMOS IMAGE SENSOR

(71) Applicant: SAMSUNG SDI CO., LTD., Yongin-si (KR)

(72) Inventors: Ieju Kim, Suwon-si (KR); Chaehyuk Ko, Suwon-si (KR); Sundae Kim, Suwon-si (KR); Baek Soung Park, Suwon-si (KR); Yeji Yang, Suwon-si (KR); Young Lee, Suwon-si (KR); Jungsun Lee, Suwon-si (KR); Myungho Cho, Suwon-si (KR); Xinhui Feng, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 738 days.

(21) Appl. No.: 17/845,043

(22) Filed: Jun. 21, 2022

(65) Prior Publication Data

US 2023/0002618 A1    Jan. 5, 2023

(30) Foreign Application Priority Data

Jun. 21, 2021  (KR) .................. 10-2021-0080241
May 27, 2022  (KR) .................. 10-2022-0065635

(51) Int. Cl.
*C09B 57/00* (2006.01)
*G03F 7/00* (2006.01)
(Continued)

(52) U.S. Cl.
CPC .......... *C09B 57/007* (2013.01); *G03F 7/0007* (2013.01); *G03F 7/004* (2013.01); *H10F 39/18* (2025.01)

(58) Field of Classification Search
CPC ..... C09B 57/007; G03F 7/0007; G03F 7/004; G03F 7/027; G03F 7/09; G03F 7/105; G02B 1/04; G02B 5/30; H10F 39/18
See application file for complete search history.

(56) References Cited

U.S. PATENT DOCUMENTS

2019/0256713 A1   8/2019   Jeong et al.
2019/0382587 A1   12/2019  Seo et al.
2020/0308099 A1   10/2020  Jeong et al.

FOREIGN PATENT DOCUMENTS

CN    107793327 A    3/2018
CN    109312169 A    2/2019
(Continued)

OTHER PUBLICATIONS

Taiwanese Search Report dated Mar. 6, 2023.
(Continued)

*Primary Examiner* — Mark F. Huff
*Assistant Examiner* — Kevin J Drummey
(74) *Attorney, Agent, or Firm* — Lee IP Law, P.C.

(57) ABSTRACT

A core-shell compound, a photosensitive resin composition including the same, a photosensitive resin layer manufactured using the photosensitive resin composition, a color filter including the photosensitive resin layer, and a CMOS image sensor including the color filter, the core-shell compound including a core represented by Chemical Formula 1 and a shell surrounding the core, the shell being represented by Chemical Formula 2:

(Continued)

[Chemical Formula 1]

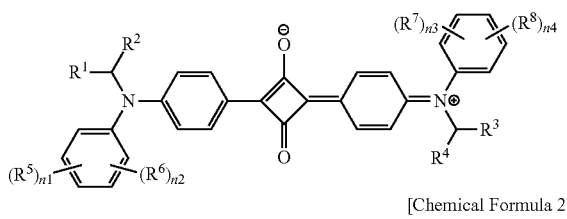

[Chemical Formula 2]

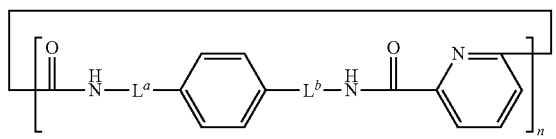

19 Claims, 1 Drawing Sheet

(51) Int. Cl.
*G03F 7/004* (2006.01)
*H10F 39/18* (2025.01)

(56) References Cited

FOREIGN PATENT DOCUMENTS

| | | | |
|---|---|---|---|
| CN | 109715599 | A | 5/2019 |
| CN | 109715600 | A | 5/2019 |
| CN | 111880373 | A | 11/2020 |
| JP | 1991-276159 | A | 12/1991 |
| JP | 2019-148796 | A | 9/2019 |
| JP | 2019-530765 | A | 10/2019 |
| JP | 2019-532145 | A | 11/2019 |
| JP | 2019-532918 | A | 11/2019 |
| JP | 2022-545559 | A | 10/2022 |
| KR | 10-2012-0016849 | A | 2/2012 |
| KR | 10-2014-0072682 | A | 6/2014 |
| KR | 10-2018-0026967 | A | 3/2018 |
| KR | 10-2018-0107968 | A | 10/2018 |
| KR | 10-2019-0063974 | A | 6/2019 |
| KR | 10-2020917 | B1 | 9/2019 |
| KR | 10-2020-0052160 | A | 5/2020 |
| TW | 201807079 | A | 3/2018 |
| WO | WO 2018/034399 | A1 | 2/2018 |
| WO | WO 2018/043829 | A1 | 3/2018 |
| WO | WO 2019/167696 | A1 | 9/2019 |
| WO | WO 2021/045466 | A1 | 3/2021 |

OTHER PUBLICATIONS

Office Action (including a search report) of the corresponding Chinese Patent Application No. 202210696402.4 dated Jun. 9, 2023.

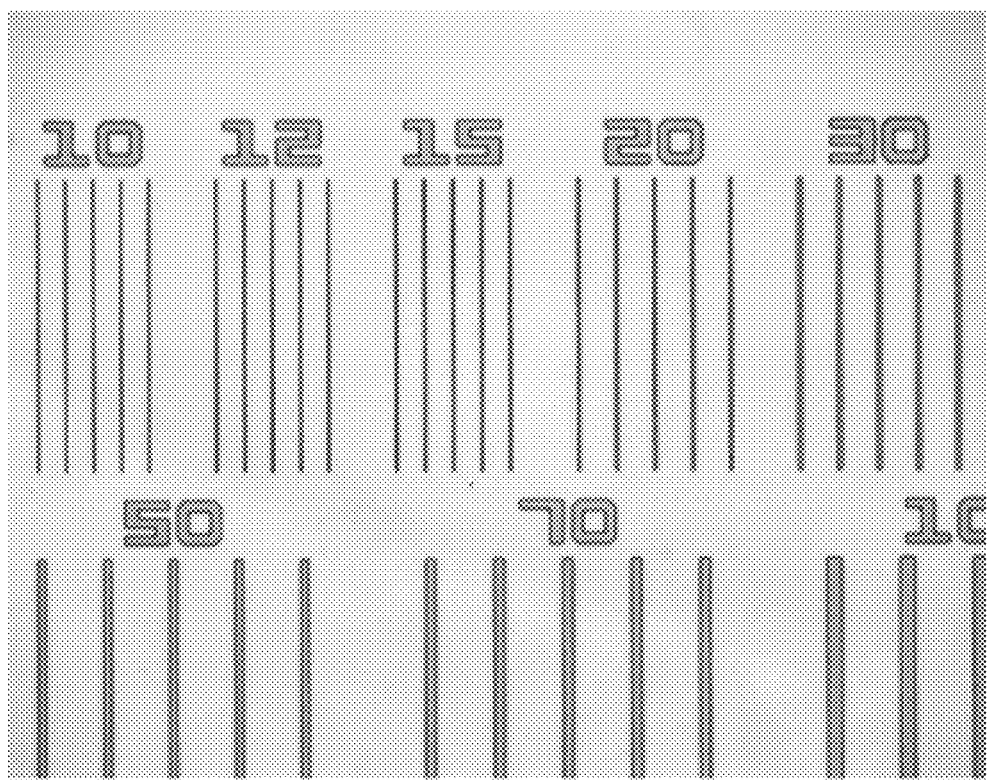

CORE-SHELL COMPOUND, PHOTOSENSITIVE RESIN COMPOSITION INCLUDING THE SAME, PHOTOSENSITIVE RESIN LAYER, COLOR FILTER, AND CMOS IMAGE SENSOR

CROSS-REFERENCE TO RELATED APPLICATION

This application claims priority to and the benefit of Korean Patent Application No. 10-2021-0080241, filed in the Korean Intellectual Property Office on Jun. 21, 2021, and Korean Patent Application No. 10-2022-0065635, filed in the Korean Intellectual Property Office on May 27, 2022, the entire contents of both of which are incorporated herein by reference.

BACKGROUND

1. Field

Embodiments relate to a core-shell compound, a photosensitive resin composition including the same, a photosensitive resin layer manufactured using the photosensitive resin composition, a color filter including the photosensitive resin layer, and a CMOS image sensor including the color filter.

2. Description of the Related Art

With the recent rapid development of advanced information and communication processing technology and overall electronics industry, a next generation detector rapidly transmitting and receiving a large amount of information and the development of a new concept device and system have been considered. With the rise of video processing and the like in mobile devices, technology development of an ultra-downsized and ultra-power-saving image sensor is rapidly accelerated, centering on existing CCD (Charge Coupled Device) and CMOS (Complementary Metal Oxide Semiconductor).

An image sensor, which is a semiconductor that converts photons into electrons and displays them on a display or stores them in a storage device, may include a light receiving element that converts light signals into electrical signals, a pixel circuit portion that amplifies and compresses the converted electrical signals, and an ASIC portion that converts these pre-treated analog signals into digital signals to treat image signals and for example, includes CCD, CMOS, CIS (Contact Image Sensor), and the like.

The CCD and CMOS image sensors use the same light-receiving element, but in the CCD image sensor, charges generated in the light-receiving element sequentially move through MOS capacitors connected in series and are converted into voltages in a source follower connected at the final end. In the CMOS image sensor, the charges are converted into voltages in a source follower built into each pixel and output to the outside. The CCD image sensor moves electrons generated by light as they are to an output unit by using a gate pulse, and the CMOS image sensor convert the electrons generated by light into voltages in each pixel and then output them through several CMOS switches. These image sensors are very widely applied from household products such as a digital camera and a mobile phone to an endoscope used in hospitals and a telescope used in a satellite orbiting the earth.

SUMMARY

The embodiments may be realized by providing a core-shell compound including a core represented by Chemical Formula 1 and a shell surrounding the core, the shell being represented by Chemical Formula 2:

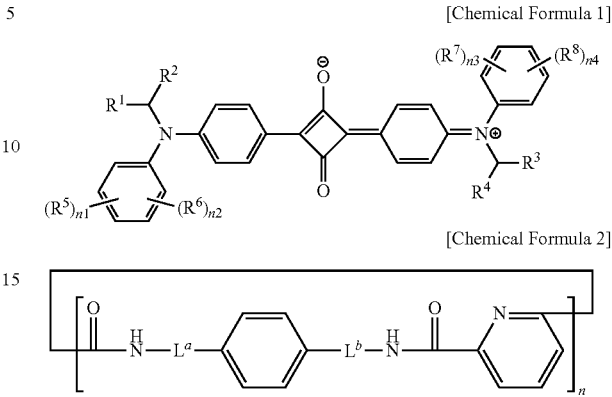

[Chemical Formula 1]

[Chemical Formula 2]

wherein, in Chemical Formula 1 and Chemical Formula 2, $R^1$ to $R^8$ are each independently a hydrogen atom, a substituted or unsubstituted C1 to C20 alkyl group, a substituted or unsubstituted C3 to C20 cycloalkyl group, or a substituted or unsubstituted C1 to C20 alkoxy group, provided that $R^1$ to $R^8$ are not all simultaneously a hydrogen atom, $R^1$ and $R^2$ may be fused to each other to form a fused ring, $R^3$ and $R^4$ may be fused to each other to form a fused ring, at least one of $R^1$, $R^2$, $R^5$, and $R^6$ includes a substituted or unsubstituted C10 to C20 alkyl group or a substituted or unsubstituted C3 to C20 cycloalkyl group, at least one of $R^3$, $R^4$, $R^7$, and $R^8$ includes a substituted or unsubstituted C10 to C20 alkyl group or a substituted or unsubstituted C3 to C20 cycloalkyl group, $L^a$ and $L^b$ are each independently a single bond or a substituted or unsubstituted C1 to C10 alkylene group, n1, n2, n3, and n4 are each independently an integer of 0 to 5, $1 \leq n1+n2 \leq 3$, $1 \leq n3+n4 \leq 3$, and n is an integer greater than or equal to 2.

At least one of $R^1$ to $R^8$ may include a substituted or unsubstituted C3 to C20 cycloalkyl group, and the substituted or unsubstituted C3 to C20 cycloalkyl group may be a substituted or unsubstituted cyclohexyl group.

At least one of $R^1$, $R^2$, $R^5$, and $R^6$ may include a substituted or unsubstituted C3 to C20 cycloalkyl group at a terminal end thereof, and at least one of $R^3$, $R^4$, $R^7$, and $R^8$ may include a substituted or unsubstituted C3 to C20 cycloalkyl group at a terminal end thereof.

$R^5$ and $R^6$ may be different from each other, and $R^7$ and $R^8$ may be different from each other.

One of $R^1$, $R^2$, $R^5$, and $R^6$ may be an unsubstituted C10 to C20 alkyl group, a C10 to C20 alkyl group substituted with a cyclohexyl group at a terminal end thereof, or a substituted or unsubstituted cyclohexyl group, and one of $R^3$, $R^4$, $R^7$, and $R^8$ may be an unsubstituted C10 to C20 alkyl group, a C10 to C20 alkyl group substituted with a cyclohexyl group at a terminal end thereof, or a substituted or unsubstituted cyclohexyl group.

Two of $R^1$, $R^2$, $R^5$, and $R^6$ may be each independently an unsubstituted C10 to C20 alkyl group, a C10 to C20 alkyl group substituted with a cyclohexyl group at a terminal end thereof, or a substituted or unsubstituted cyclohexyl group, and two of $R^3$, $R^4$, $R^7$, and $R^8$ may be each independently an unsubstituted C10 to C20 alkyl group, a C10 to C20 alkyl group substituted with a cyclohexyl group at a terminal end thereof, or a substituted or unsubstituted cyclohexyl group.

Three of $R^1$, $R^2$, $R^5$, and $R^6$ may be each independently an unsubstituted C10 to C20 alkyl group, a C10 to C20 alkyl group substituted with a cyclohexyl group at a terminal end thereof, or a substituted or unsubstituted cyclohexyl group, and three of $R^3$, $R^4$, $R^7$, and $R^8$ may be each independently an unsubstituted C10 to C20 alkyl group, a C10 to C20 alkyl group substituted with a cyclohexyl group at a terminal end thereof, or a substituted or unsubstituted cyclohexyl group.

Chemical Formula 1 may be represented by Chemical Formula 1-1:

[Chemical Formula 1-1]

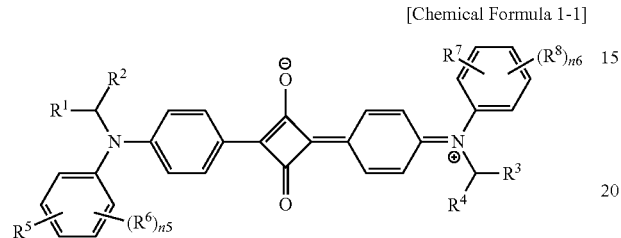

in Chemical Formula 1-1, $R^1$ to $R^4$, $R^6$, and $R^8$ may be each independently a hydrogen atom, a substituted or unsubstituted C1 to C20 alkyl group, a substituted or unsubstituted cyclohexyl group, or a substituted or unsubstituted C1 to C20 alkoxy group, provided that $R^1$ to $R^4$, $R^6$, and $R^8$ are not all simultaneously a hydrogen atom, $R^1$ and $R^2$ may be fused to each other to form a fused ring, $R^3$ and $R^4$ may be fused to each other to form a fused ring, $R^5$ and $R^7$ may be each independently an unsubstituted C10 to C20 alkyl group, a C10 to C20 alkyl group substituted with a cyclohexyl group at a terminal end thereof, or a substituted or unsubstituted cyclohexyl group, and n5 and n6 may be each independently an integer of 0 to 2.

Chemical Formula 1 may be represented by Chemical Formula 1-2:

[Chemical Formula 1-2]

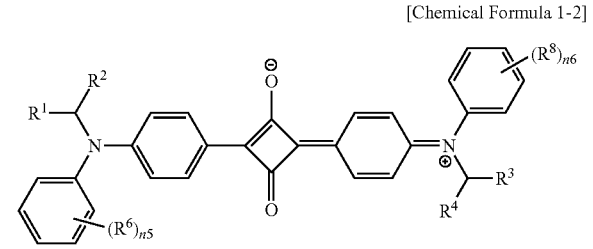

in Chemical Formula 1-2, $R^2$, $R^4$, $R^6$, and $R^8$ may be each independently a hydrogen atom, a substituted or unsubstituted C1 to C20 alkyl group, a substituted or unsubstituted cyclohexyl group, or a substituted or unsubstituted C1 to C20 alkoxy group, provided that $R^2$, $R^4$, $R^6$, and $R^8$ are not all simultaneously a hydrogen atom, $R^1$ and $R^2$ may be fused to each other to form a fused ring, $R^3$ and $R^4$ may be fused to each other to form a fused ring, $R^1$ and $R^3$ may be each independently an unsubstituted C10 to C20 alkyl group, a C10 to C20 alkyl group substituted with a cyclohexyl group at a terminal end thereof, or a substituted or unsubstituted cyclohexyl group, and n5 and n6 may be each independently an integer of 0 to 2.

Chemical Formula 1 may be represented by Chemical Formula 1-3:

[Chemical Formula 1-3]

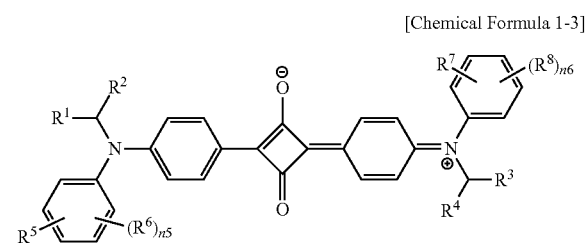

in Chemical Formula 1-3, $R^2$, $R^4$, $R^6$, and $R^8$ may be each independently a hydrogen atom, a substituted or unsubstituted C1 to C20 alkyl group, a substituted or unsubstituted cyclohexyl group, or a substituted or unsubstituted C1 to C20 alkoxy group, provided that $R^2$, $R^4$, $R^6$, and $R^8$ are not all simultaneously a hydrogen atom, $R^1$ and $R^2$ may be fused to each other to form a fused ring, $R^3$ and $R^4$ may be fused to each other to form a fused ring, $R^1$, $R^3$, $R^5$, and $R^7$ may be each independently an unsubstituted C10 to C20 alkyl group, a C10 to C20 alkyl group substituted with a cyclohexyl group at a terminal end thereof, or a substituted or unsubstituted cyclohexyl group, and n5 and n6 may be each independently an integer of 0 to 2.

Chemical Formula 1 may be represented by Chemical Formula 1-4:

[Chemical Formula 1-4]

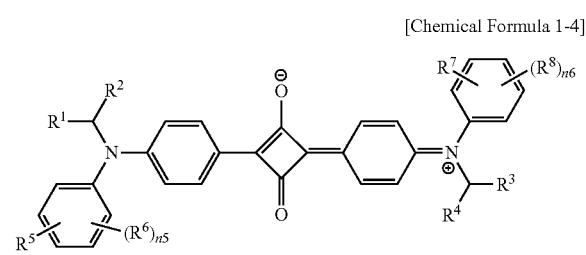

in Chemical Formula 1-4, $R^6$ and $R^8$ may be each independently a hydrogen atom, a substituted or unsubstituted C1 to C20 alkyl group, a substituted or unsubstituted cyclohexyl group, or a substituted or unsubstituted C1 to C20 alkoxy group, $R^1$ and $R^2$ may be fused to each other to form a fused ring, $R^3$ and $R^4$ may be fused to each other to form a fused ring, $R^1$ to $R^5$ and $R^7$ may be each independently an unsubstituted C10 to C20 alkyl group, a C10 to C20 alkyl group substituted with a cyclohexyl group at a terminal end thereof, or a substituted or unsubstituted cyclohexyl group, and n5 and n6 may be each independently an integer of 0 to 2.

The core represented by Chemical Formula 1 may have a maximum absorption wavelength at about 610 nm to about 640 nm.

The shell represented by Chemical Formula 2 may be represented by Chemical Formula 2-1:

[Chemical Formula 2-1]

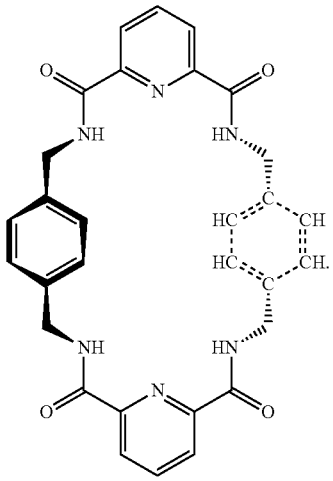

The core-shell compound may be a green dye.

The embodiments may be realized by providing a photosensitive resin composition including the core-shell compound according to an embodiment.

The photosensitive resin composition may further include a binder resin, a photopolymerizable monomer, a photopolymerization initiator, and a solvent.

The photosensitive resin composition may be used for a CMOS image sensor.

The embodiments may be realized by providing a photosensitive resin layer manufactured using the photosensitive resin composition according to an embodiment.

The embodiments may be realized by providing a color filter including the photosensitive resin layer according to an embodiment.

The embodiments may be realized by providing a CMOS image sensor including the color filter according to an embodiment.

BRIEF DESCRIPTION OF THE DRAWING

Features will be apparent to those of skill in the art by describing in detail exemplary embodiments with reference to the attached drawing in which:

The FIG. is an image after immersing a color filter specimen manufactured using the composition including the compound according to Example 1 as a dye in a PGMEA solution for 10 minutes.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, "substituted" refers to one substituted with a substituent selected from a halogen (F, Br, Cl, or I), a hydroxy group, a nitro group, a cyano group, an amino group ($NH_2$, $NH(R^{200})$, or $N(R^{201})(R^{202})$, wherein $R^{200}$, $R^{201}$, and $R^{202}$ are the same or different, and are each independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group (e.g., an alkoxy group), a substituted or unsubstituted aryl group, and a substituted or unsubstituted heterocyclic group.

As used herein, when specific definition is not otherwise provided, "alkyl group" refers to a C1 to C20 alkyl group, and specifically a C1 to C15 alkyl group, "cycloalkyl group" refers to a C3 to C20 cycloalkyl group, and specifically a C3 to C18 cycloalkyl group, "alkoxy group" refers to a C1 to C20 alkoxy group, and specifically a C1 to C18 alkoxy group, "aryl group" refers to a C6 to C20 aryl group, and specifically a C6 to C18 aryl group, "alkenyl group" refers to a C2 to C20 alkenyl group, and specifically a C2 to C18 alkenyl group, "alkylene group" refers to a C1 to C20 alkylene group, and specifically C1 to C18 alkylene group, and "arylene group" refers to a C6 to C20 arylene group, and specifically a C6 to C16 arylene group.

As used herein, when specific definition is not otherwise provided, "(meth)acrylate" refers to "acrylate" and "methacrylate," and "(meth)acrylic acid" refers to "acrylic acid" and "methacrylic acid."

As used herein, when specific definition is not otherwise provided, "combination" refers to mixing or copolymerization. In addition, "copolymerization" refers to block copolymerization or random copolymerization, and "copolymer" refers to block copolymerization or random copolymerization. As used herein, the term "or" is not an exclusive term, e.g., "A or B" would include A, B, or A and B.

In the chemical formula of the present specification, unless a specific definition is otherwise provided, hydrogen is bonded at the position when a chemical bond is not drawn where supposed to be given.

In the present specification, when specific definition is not otherwise provided, "*" indicates a point where the same or different atom or chemical formula is linked.

An embodiment provides a core-shell compound including, e.g., a core represented by Chemical Formula 1 and a shell surrounding the core and represented by Chemical Formula 2.

[Chemical Formula 1]

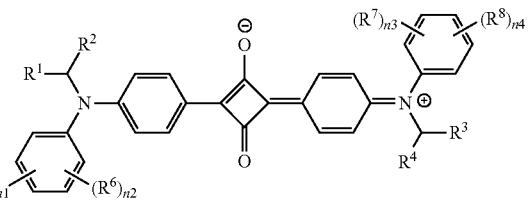

[Chemical Formula 2]

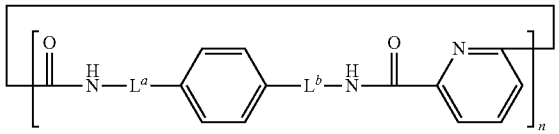

In Chemical Formula 1 and Chemical Formula 2, $R^1$ to $R^8$ may each independently be or include, e.g., a hydrogen atom, a substituted or unsubstituted C1 to C20 alkyl group, a substituted or unsubstituted C3 to C20 cycloalkyl group, or a substituted or unsubstituted C1 to C20 alkoxy group. In an implementation, $R^1$ to $R^8$ are not all simultaneously a hydrogen atom.

$R^1$ and $R^2$ may be fused to each other to form a fused ring.

$R^3$ and $R^4$ may be fused to each other to form a fused ring.

In an implementation, at least one of $R^1$, $R^2$, $R^5$, and $R^6$ may include, e.g., a substituted or unsubstituted C10 to C20 alkyl group or a substituted or unsubstituted C3 to C20 cycloalkyl group.

In an implementation, at least one of $R^3$, $R^4$, $R^7$, and $R^8$ may include, e.g., a substituted or unsubstituted C10 to C20 alkyl group or a substituted or unsubstituted C3 to C20 cycloalkyl group.

$L^a$ and $L^b$ may each independently be or include, e.g., a single bond or a substituted or unsubstituted C1 to C10 alkylene group.

n1, n2, n3, and n4 may each independently be, e.g., an integer of 0 to 5, 1≤n1+n2≤3, 1≤n3+n4≤3.

n may be, e.g., an integer greater than or equal to 2. In an implementation, n may be an integer of 2 to 10.

In an implementation, in the above definition of $R^1$ to $R^8$, the substituted or unsubstituted C1 to C20 alkoxy group may be an unsubstituted C1 to C20 alkoxy group or a C1 to C20 alkoxy group substituted with a C1 to C20 alkyl group, an epoxy group, or a combination thereof.

In an implementation, the fused ring may be a substituted or unsubstituted cyclohexyl group. In an implementation, the fused ring may be a cyclohexyl group unsubstituted or substituted with a C1 to C10 alkoxy group.

A color filter formed of a pigment photosensitive resin composition may have a color mixing problem due to particle sizes of the pigment and a limit to film-thinning. In addition, a color imaging device for an image sensor may use a smaller dispersed particle size to form a fine pattern. Accordingly, efforts to improve resolution by introducing a non-particle dye instead of the pigment to prepare a photosensitive resin composition suitable for the dye have been considered.

The embodiments relate to a green dye used in a color filter for a CMOS image sensor. As pixels have a smaller size, there may be a limit to manufacture a fine pattern by using a pigment, and accordingly, a dye may be used to compensate for this. A dye may have issues in terms of processability during the pattern manufacturing, e.g., may exhibit much deteriorated chemical resistance, it may be very difficult to form a fine pattern after the curing and thermal process. In addition, when the dye as a colorant is included in a small amount based on the total amount of the composition, the chemical resistance of the dye itself may be a little insufficient. When the photosensitive resin composition for a CMOS image sensor includes the dye in an excessive amount (about 20 wt % to about 50 wt %, e.g., about 20 wt % to about 45 wt % based on the total amount of the photosensitive resin composition), a dye with excellent chemical resistance itself may be used.

One or more embodiments may provide a core-shell compound prepared by introducing a long-chain alkyl group or cycloalkyl group under specific controls into a squarylium compound forming a core, and surrounding the core with a shell. The core-shell compound itself according to an embodiment may have excellent chemical resistance, and a photosensitive resin composition including an excess of this compound as a green dye exhibits no significant deterioration of the chemical resistance even after the curing and thermal process and thus may be very suitable for a green color filter for the CMOS image sensor.

In an implementation, the substituted or unsubstituted C3 to C20 cycloalkyl group may be a substituted or unsubstituted cyclohexyl group. In an implementation, the cyclohexyl group may be substituted with a C1 to C20 alkoxy group.

In an implementation, at least one of $R^1$, $R^2$, $R^5$, and $R^6$ may include, e.g., a substituted or unsubstituted C3 to C20 cycloalkyl group at a terminal end thereof. In an implementation, at least one of $R^3$, $R^4$, $R^7$, and $R^8$ may include, e.g., a substituted or unsubstituted C3 to C20 cycloalkyl group at the terminal end.

In an implementation, in Chemical Formula 1, $R^5$ and $R^6$ may be different from each other and simultaneously $R^7$ and $R^8$ may be different from each other.

In an implementation, one of $R^1$, $R^2$, $R^5$, and $R^6$ may be, e.g., an unsubstituted C10 to C20 alkyl group, a C10 to C20 alkyl group substituted with a cyclohexyl group at a terminal end thereof, or a substituted or unsubstituted cyclohexyl group. In an implementation, one of $R^3$, $R^4$, $R^7$, and $R^8$ may be, e.g., a C10 to C20 alkyl group, a C10 to C20 alkyl group substituted with a cyclohexyl group at a terminal end thereof, or a substituted or unsubstituted cyclohexyl group. In an implementation, the core represented by Chemical Formula 1 may include two functional groups (a C10 to C20 alkyl group unsubstituted or substituted with a cyclohexyl group at the terminal end or a substituted or unsubstituted cyclohexyl group). In an implementation, the core represented by Chemical Formula 1 may be, e.g., represented by Chemical Formula 1-1 or Chemical Formula 1-2.

[Chemical Formula 1-1]

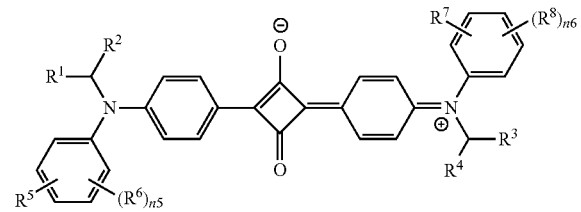

In Chemical Formula 1-1, $R^1$ to $R^4$, $R^6$, and $R^8$ may each independently be, e.g., a hydrogen atom, a substituted or unsubstituted C1 to C20 alkyl group, a substituted or unsubstituted cyclohexyl group, or a substituted or unsubstituted C1 to C20 alkoxy group. In an implementation, $R^1$ to $R^4$, $R^6$, and $R^8$ are not all simultaneously a hydrogen atom.

In an implementation, $R^1$ and $R^2$ may be fused to each other to form a fused ring.

In an implementation, $R^3$ and $R^4$ may be fused to each other to form a fused ring.

$R^5$ and $R^7$ may each independently be, e.g., an unsubstituted C10 to C20 alkyl group, a C10 to C20 alkyl group substituted with a cyclohexyl group at a terminal end thereof, or a substituted or unsubstituted cyclohexyl group.

n5 and n6 may each independently be, e.g., an integer of 0 to 2.

[Chemical Formula 1-2]

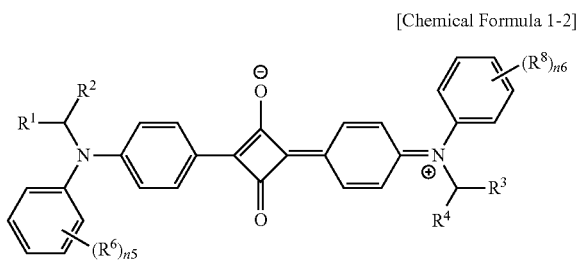

In Chemical Formula 1-2, $R^2$, $R^4$, $R^6$, and $R^8$ may each independently be, e.g., a hydrogen atom, a substituted or unsubstituted C1 to C20 alkyl group, a substituted or unsubstituted cyclohexyl group, or a substituted or unsubstituted C1 to C20 alkoxy group. In an implementation, $R^2$, $R^4$, $R^6$, and $R^8$ are not all simultaneously a hydrogen atom.

In an implementation, $R^1$ and $R^2$ may be fused to each other to form a fused ring.

In an implementation, $R^3$ and $R^4$ may be fused to each other to form a fused ring.

$R^1$ may be, e.g., an unsubstituted C10 to C20 alkyl group, a C10 to C20 alkyl group substituted with a cyclohexyl group at a terminal end thereof, or a substituted or unsubstituted cyclohexyl group.

n5 and n6 may each independently be, e.g., an integer of 0 to 2.

In an implementation, two of $R^1$, $R^2$, $R^5$, and $R^6$ may each independently be, e.g., an unsubstituted C10 to C20 alkyl group, a C10 to C20 alkyl group substituted with a cyclohexyl group at a terminal end thereof, or a substituted or unsubstituted cyclohexyl group. In an implementation, two of $R^3$, $R^4$, $R^7$, and $R^8$ may each independently be, e.g., an unsubstituted C10 to C20 alkyl group, a C10 to C20 alkyl group substituted with a cyclohexyl group at a terminal end thereof, or a substituted or unsubstituted cyclohexyl group. In an implementation, the core represented by Chemical Formula 1 may include four functional groups (e.g., of an unsubstituted C10 to C20 alkyl group, a C10 to C20 alkyl group substituted with a cyclohexyl group at a terminal end thereof, or a substituted or unsubstituted cyclohexyl group). In an implementation, the core represented by Chemical Formula 1 may be represented by Chemical Formula 1-3.

[Chemical Formula 1-3]

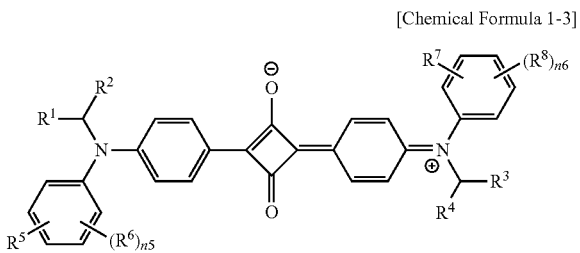

In Chemical Formula 1-3, $R^2$, $R^4$, $R^6$, and $R^8$ may each independently be, e.g., a hydrogen atom, a substituted or unsubstituted C1 to C20 alkyl group, a substituted or unsubstituted cyclohexyl group, or a substituted or unsubstituted C1 to C20 alkoxy group. In an implementation, $R^2$, $R^4$, $R^6$, and $R^8$ are not all simultaneously a hydrogen atom.

In an implementation, $R^1$ and $R^2$ may be fused to each other to form a fused ring.

In an implementation, $R^3$ and $R^4$ may be fused to each other to form a fused ring.

$R^1$, $R^3$, $R^5$, and $R^7$ may each independently be, e.g., an unsubstituted C10 to C20 alkyl group, a C10 to C20 alkyl group substituted with a cyclohexyl group at a terminal end thereof, or a substituted or unsubstituted cyclohexyl group.

n5 and n6 may each independently be, e.g., an integer of 0 to 2.

In an implementation, three of $R^1$, $R^2$, $R^5$, and $R^6$ may each independently be, e.g., an unsubstituted C10 to C20 alkyl group, a C10 to C20 alkyl group substituted with a cyclohexyl group at a terminal end thereof, or a substituted or unsubstituted cyclohexyl group. In an implementation, three of $R^3$, $R^4$, $R^7$, and $R^8$ may each independently be, e.g., an unsubstituted C10 to C20 alkyl group, a C10 to C20 alkyl group substituted with a cyclohexyl group at a terminal end thereof, or a substituted or unsubstituted cyclohexyl group. In an implementation, the core represented by Chemical Formula 1 may include six functional groups (e.g., of an unsubstituted C10 to C20 alkyl group, a C10 to C20 alkyl group substituted with a cyclohexyl group at a terminal end thereof, or a substituted or unsubstituted cyclohexyl group). In an implementation, the core represented by Chemical Formula 1 may be represented by Chemical Formula 1-4.

[Chemical Formula 1-4]

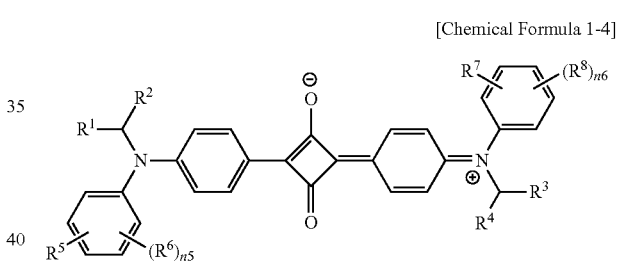

In Chemical Formula 1-4, $R^6$ and $R^8$ may each independently be, e.g., a hydrogen atom, a substituted or unsubstituted C1 to C20 alkyl group, a substituted or unsubstituted cyclohexyl group, or a substituted or unsubstituted C1 to C20 alkoxy group.

In an implementation, $R^1$ and $R^2$ may be fused to each other to form a fused ring.

In an implementation, $R^3$ and $R^4$ may be fused to each other to form a fused ring.

$R^1$ to $R^5$ and $R^7$ may each independently be, e.g., an unsubstituted C10 to C20 alkyl group, a C10 to C20 alkyl group substituted with a cyclohexyl group at a terminal end thereof, or a substituted or unsubstituted cyclohexyl group.

n5 and n6 may each independently be, e.g., an integer of 0 to 2.

In an implementation, the core represented by Chemical Formula 1 may include, e.g., 2, 4, or 6 of an unsubstituted C10 to C20 alkyl group, a C10 to C20 alkyl group substituted with a cyclohexyl group at a terminal end thereof, or a substituted or unsubstituted cyclohexyl group. If the core represented by Chemical Formula 1 were to include 1, 3, or 5 of the unsubstituted C10 to C20 alkyl group, C10 to C20 alkyl group substituted with a cyclohexyl group at a terminal end thereof, or substituted or unsubstituted cyclohexyl group, it could be difficult to structurally synthesize (e.g., a low yield) and even if synthesized, costs would be high and thus it may not be economical, when applied to an actual line.

In an implementation, the core represented by Chemical Formula 1 may exhibit excellent chemical resistance, when the number of the functional group (e.g., the unsubstituted C10 to C20 alkyl group, C10 to C20 alkyl group substituted with a cyclohexyl group at a terminal end thereof, or substituted or unsubstituted cyclohexyl group) is 2 rather than 4 and also, when the number is 4 rather than 6. In an implementation, when the compound is considered with respect to the chemical resistance alone, in the core represented by Chemical Formula 1 structure, the number of the functional group (e.g., the unsubstituted C10 to C20 alkyl group, C10 to C20 alkyl group substituted with a cyclohexyl group at a terminal end thereof, or substituted or unsubstituted cyclohexyl group) may be 4 rather than 6 and 2 rather than 4.

In an implementation, if the core represented by Chemical Formula 1 were to include only one functional group (e.g., of an unsubstituted C10 to C20 alkyl group, a C10 to C20 alkyl group substituted with a cyclohexyl group at a terminal end thereof, or a substituted or unsubstituted cyclohexyl group), the core may not only be difficult to synthesize as described above, but also the chemical resistance may be rather deteriorated, compared with the core including two functional group (of an unsubstituted C10 to C20 alkyl group, a C10 to C20 alkyl group substituted with a cyclohexyl group at a terminal end thereof, or a substituted or unsubstituted cyclohexyl group). In an implementation, the core represented by Chemical Formula 1 may include two or more functional groups (e.g., of an unsubstituted C10 to C20 alkyl group, a C10 to C20 alkyl group substituted with a cyclohexyl group at a terminal end thereof, or a substituted or unsubstituted cyclohexyl group).

In an implementation, the core represented by Chemical Formula 1 may have a maximum absorption wavelength (e.g., wavelength of maximum or peak absorbance) at, e.g., about 610 nm to about 640 nm. If a dye compound having excellent solubility of greater than or equal to about 10% in an organic solvent were to have a maximum absorption wavelength outside of the range of about 610 nm to about 640 nm, it may not be appropriately applied to a green photosensitive resin composition for a CMOS image sensor due to low transmittance.

In an implementation, the shell represented by Chemical Formula 2 may be represented by Chemical Formula 2-1.

[Chemical Formula 2-1]

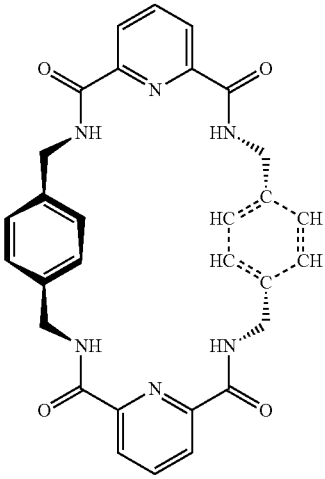

In an implementation, the core-shell compound may be represented by, e.g., Chemical Formula A or Chemical Formula B.

[Chemical Formula A]

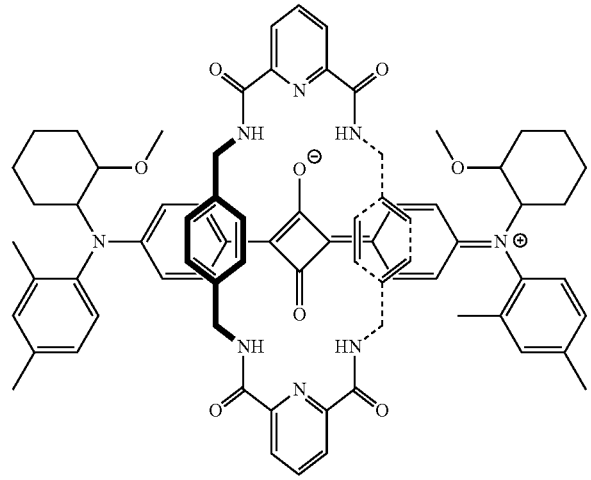

-continued

[Chemical Formula B]

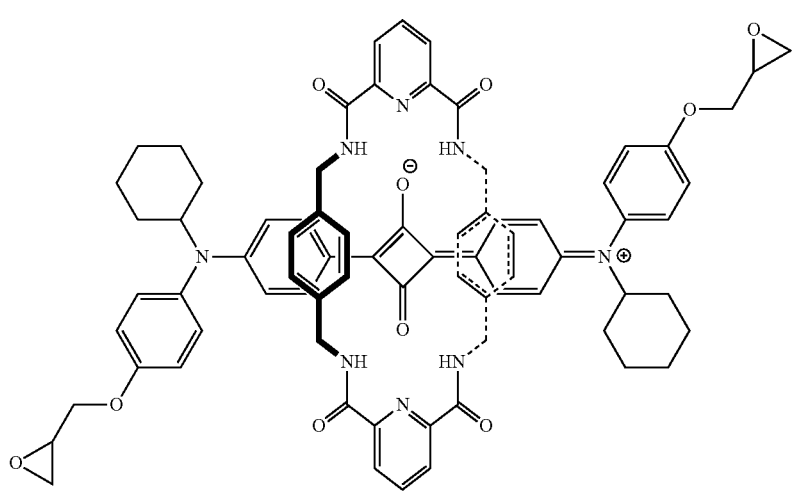

In an implementation, the core-shell compound may include a core represented by Chemical Formula C, Chemical Formula D, Chemical Formula E, Chemical Formula F, Chemical Formula G, Chemical Formula H, Chemical Formula I, Chemical Formula J, Chemical Formula K, Chemical Formula L, Chemical Formula M or Chemical Formula N and a shell surrounding the core, the shell may be represented by the Chemical Formula 2-1.

[Chemical Formula C]

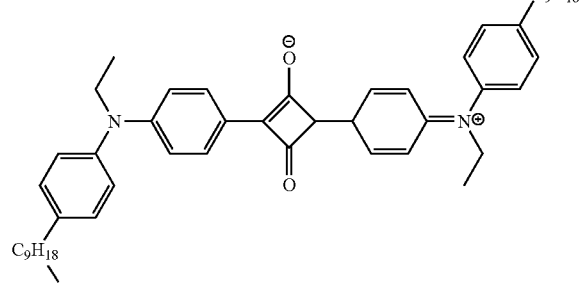

[Chemical Formula D]

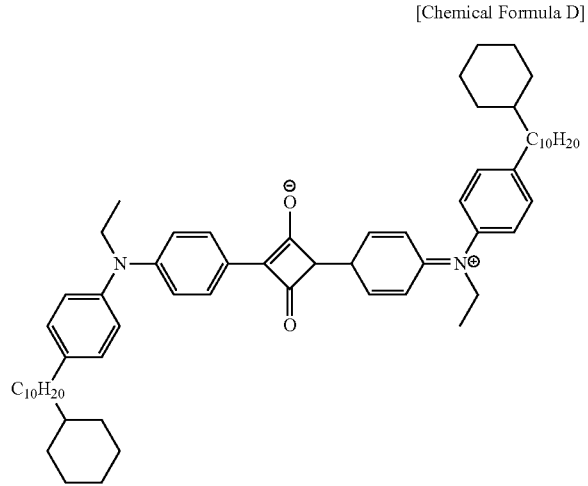

-continued

[Chemical Formula E]

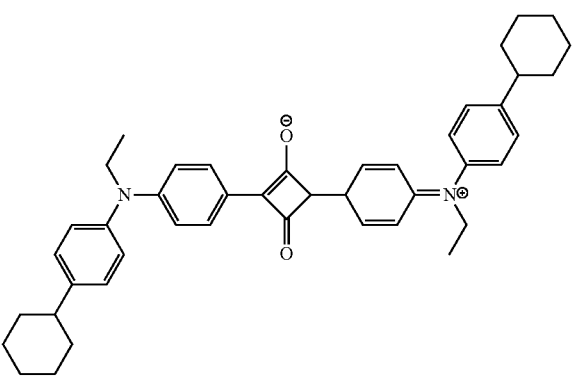

[Chemical Formula F]

[Chemical Formula G]

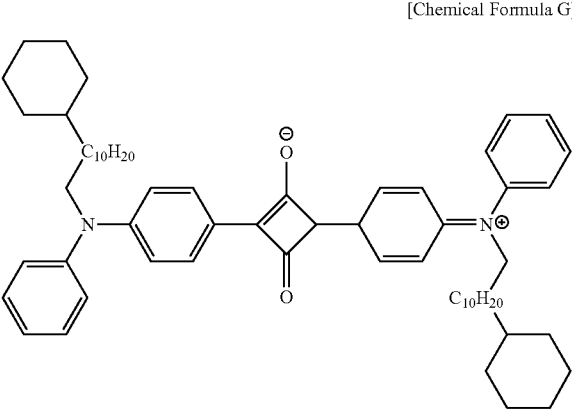

-continued

[Chemical Formula H]
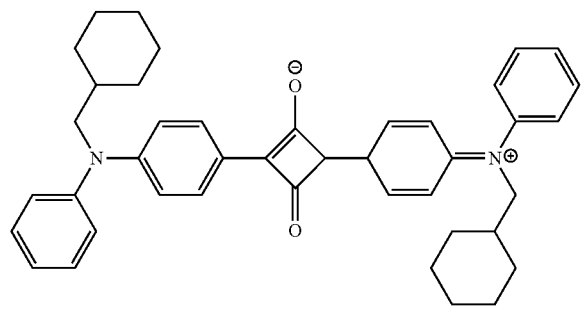

[Chemical Formula I]
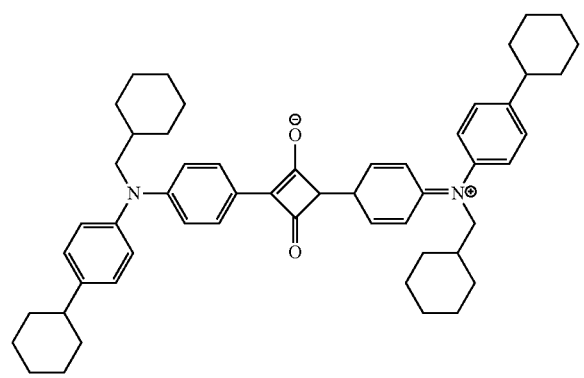

[Chemical Formula J]
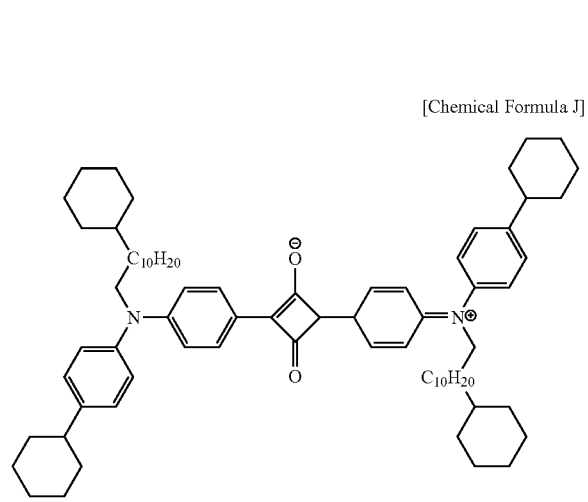

[Chemical Formula K]
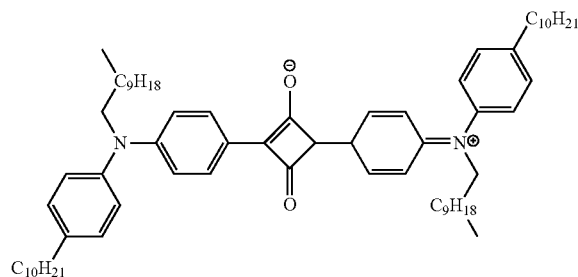

[Chemical Formula L]
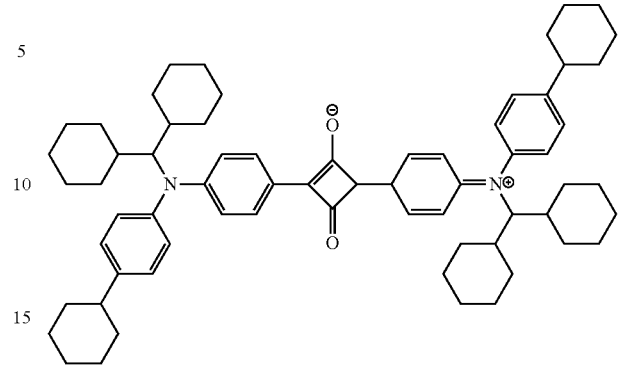

[Chemical Formula M]
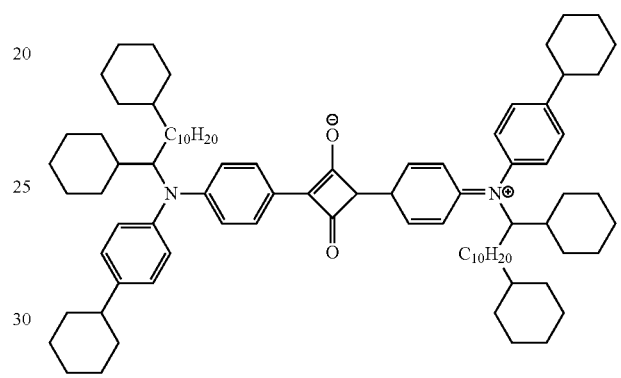

[Chemical Formula N]
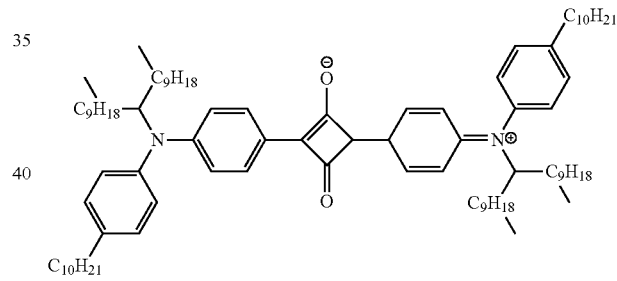

In an implementation, the core-shell compound may be a green dye.

According to another embodiment, a photosensitive resin composition including the core-shell compound according to the embodiment may be provided.

In an implementation, the photosensitive resin composition may have, e.g., a transmittance of greater than or equal to about 90% at 540 nm, a transmittance of less than or equal to about 10% at 600 nm to 640 nm, and a transmittance of less than or equal to about 5% at 450 nm and thus, may be suitable for realizing a green color filter for high transmission type CIS. In an implementation, the photosensitive resin composition may be used for a high transmission type CMOS image sensor.

In an implementation, the photosensitive resin composition may include, e.g., the core-shell compound, a binder resin, a photopolymerizable monomer, a photopolymerization initiator, and a solvent.

The core-shell compound according to an embodiment may be included in an amount of about 20 wt % to about 50 wt %, e.g., about 20 wt % to about 45 wt %, about 30 wt % to about 45 wt %, or about 35 wt % to about 45 wt %, based on a total weight of the photosensitive resin composition. When the core-shell compound according to an embodiment is included in the above range, color reproducibility and contrast ratio may be improved, and application to a CMOS image sensor may be enabled.

In an implementation, the photosensitive resin composition may further include a pigment, e.g., a yellow pigment, a green pigment, or a combination thereof.

The yellow pigment may include, e.g., C.I. pigment yellow 138, C.I. pigment yellow 139, C.I. pigment yellow 150, C.I. pigment yellow 185, or the like, in a color index, and these may be used alone or as a mixture of two or more.

The green pigment may include, e.g., C.I. pigment green 36, C.I. pigment green 58, C.I. pigment green 59, or the like, in a color index, and these may be used alone or as a mixture of two or more.

The pigment may be included in the photosensitive resin composition in the form of pigment dispersion.

The pigment dispersion may include a solid pigment, a solvent, and a dispersing agent for uniformly dispersing the pigment in the solvent.

The solid pigment may be included in an amount of about 1 wt % to about 20 wt %, e.g., about 8 wt % to about 20 wt %, about 8 wt % to about 15 wt %, about 10 wt % to about 20 wt %, or about 10 wt % to about 15 wt %, based on a total weight of pigment dispersion.

The dispersing agent may be a non-ionic dispersing agent, an anionic dispersing agent, a cationic dispersing agent, or the like. Examples of the dispersing agent may include polyalkylene glycol and esters thereof, polyoxyalkylene, a polyhydric alcohol ester alkylene oxide addition product, an alcohol alkylene oxide addition product, sulfonate ester, a sulfonate salt, a carboxylate ester, a carboxylate salt, an alkylamide alkylene oxide addition product, alkyl amine, and the like, and these may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse24000GR, Solsperse 27000, Solsperse 28000, and the like made by Zeneka Co.; or PB711, PB821, and the like made by Ajinomoto Inc.

The dispersing agent may be included in an amount of about 1 wt % to about 20 wt % based on the total weight of the pigment dispersion. When the dispersing agent is included within the range, dispersion of a photosensitive resin composition is improved due to an appropriate viscosity, and thus optical, physical, and chemical quality may be maintained when the photosensitive resin composition is applied to products.

A solvent for forming the pigment dispersion may include ethylene glycol acetate, ethylcellosolve, propylene glycol methyletheracetate, ethyllactate, polyethylene glycol, cyclohexanone, propylene glycol methylether, or the like.

The pigment dispersion may be included in an amount of about 10 wt % to about 40 wt %, e.g., about 20 wt % to about 35 wt %, based on the total weight of the photosensitive resin composition. When the pigment dispersion is included within the above range, it may be advantageous to secure a process margin, and may have improved color reproducibility and contrast ratio.

The binder resin may be an acrylic binder resin.

The acrylic binder resin may be a copolymer of a first ethylenic unsaturated monomer and a second ethylenic unsaturated monomer that is copolymerizable therewith, and is a resin including at least one acrylic repeating unit.

The first ethylenic unsaturated monomer may be an ethylenic unsaturated monomer including at least one carboxyl group and examples of the monomer may include acrylic acid, methacrylic acid, maleic acid, itaconic acid, fumaric acid, or a combination thereof.

The first ethylenic unsaturated monomer may be included in an amount of about 5 wt % to about 50 wt %, e.g., about 10 wt % to about 40 wt %, based on a total weight of the acrylic binder resin.

The second ethylenic unsaturated monomer may be an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth)acrylonitrile and the like; an unsaturated amide compound such as (meth)acrylamide, and the like; or the like, and may be used alone or as a mixture of two or more.

Examples of the acrylic binder resin may include a (meth)acrylic acid/benzylmethacrylate copolymer, a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, and these may be used alone or as a mixture of two or more.

A weight average molecular weight of the binder resin may be about 3,000 g/mol to about 150,000 g/mol, e.g., about 5,000 g/mol to about 50,000 g/mol, or about 20,000 g/mol to about 30,000 g/mol. When the binder resin has a weight average molecular weight within the range, the photosensitive resin composition may have good physical and chemical properties, appropriate viscosity, and close-contacting properties with a substrate during manufacture of a color filter.

An acid value of the binder resin may be about 15 mgKOH/g to about 60 mgKOH/g, e.g., about 20 mgKOH/g to about 50 mgKOH/g. When the acid value of the binder resin is within the range, resolution of pixel patterns is improved.

The binder resin may be included in an amount of about 1 wt % to about 30 wt %, e.g., about 1 wt % to about 20 wt %, or about 1 wt % to about 10 wt % based on the total weight of the photosensitive resin composition. When the binder resin is included within the range, the composition may have an excellent developability and improved cross-linking, and thus may have excellent surface flatness when manufactured into a color filter.

The photopolymerizable monomer may be mono-functional or multi-functional ester of (meth)acrylic acid including at least one ethylenic unsaturated double bond.

The photopolymerizable monomer has the ethylenic unsaturated double bond and thus, may cause sufficient polymerization during exposure in a pattern-forming process and form a pattern having excellent heat resistance, light resistance, and chemical resistance.

Examples of the photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable monomer are as follows. The mono-functional (meth) acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth) acrylic acid ester may include Aronix M-309®, M-400®, M-405®, M-450®, M-710®, M-8030®, M-8060®, and the like of Toagosei Chemistry Industry Co., Ltd.; KAYARAD TMPTA®, DPCA-20®, DPCA-30®, DPCA-60®, DPCA-120® of Nippon Kayaku Co., Ltd., V-295®, V-300®, V-360®, V-GPT®, V-3PA®, V-400® of Osaka Yuki Kayaku Kogyo Co. Ltd., and the like. These may be used alone or as a mixture of two or more.

The photopolymerizable monomer may be treated with acid anhydride to help improve developability.

The photopolymerizable monomer may be included in an amount of about 1 wt % to about 15 wt %, e.g., about 1 wt % to about 10 wt %, or about 1 wt % to about 5 wt %, based on the total weight of the photosensitive resin composition. When the photopolymerizable monomer is included within the ranges, the photopolymerizable monomer may be sufficiently cured during exposure in a pattern-forming process and may have excellent reliability, and developability for alkali developing solution may be improved.

The photopolymerization initiator may be a suitable initiator for a photosensitive resin composition, e.g., an acetophenone compound, a benzophenone compound, a thioxanthone compound, a benzoin compound, a triazine compound, an oxime compound, or a combination thereof.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime compound may include an O-acyloxime compound, 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Examples of the O-acyloxime compound may include 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, and 1-(4-phenylsulfanyl phenyl)-butan-1-oneoxime-O-acetate, and the like.

The photopolymerization initiator may further include a carbazole compound, a diketone compound, a sulfonium borate compound, a diazo compound, an imidazole compound, a biimidazole compound, a fluorene compound, and the like, besides the compounds.

The photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of about 0.01 wt % to about 10 wt %, e.g., about 0.1 wt % to about 5 wt %, or about 0.1 wt % to about 1 wt %, based on the total weight of the photosensitive resin composition. When the photopolymerization initiator is included within the ranges, sufficient photopolymerization may occur during exposure in a pattern-forming process, excellent reliability may be realized, heat resistance, light resistance, and chemical resistance of patterns, resolution and close-contacting properties may be improved, and a decrease of transmittance due to a non-reaction initiator may be prevented.

The solvent is a material having compatibility with the core-shell compound, pigment according to an embodiment, the binder resin, the photopolymerizable monomer, and the photopolymerization initiator, but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy acetic acid alkyl esters such as oxy methyl acetate, oxy ethyl acetate, oxy butyl acetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkylesters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like, and in addition, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may also be used.

Considering compatibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like; or ketones such as cyclohexanone, and the like may be used.

The solvent may be included in a balance amount, e.g., about 20 wt % to about 80 wt %, about 20 wt % to about 70 wt %, about 20 wt % to about 60 wt %, about 20 wt % to about 50 wt %, or about 20 wt % to about 40 wt %, based on the total weight of the photosensitive resin composition. When the solvent is included within the ranges, the photosensitive resin composition may have an appropriate viscosity resulting in improvement of coating characteristics of a color filter.

The photosensitive resin composition according to another embodiment may further include an epoxy compound in order to help improve close-contacting properties with a substrate.

Examples of the epoxy compound may include a phenol novolac epoxy compound, a tetramethyl biphenyl epoxy compound, a bisphenol A epoxy compound, an alicyclic epoxy compound, or a combination thereof.

The epoxy compound may be included in an amount of about 0.01 parts by weight to about 20 parts by weight, e.g., about 0.1 parts by weight to about 10 parts by weight, based on 100 parts by weight of the photosensitive resin composition. When the epoxy compound is included within the range, close-contacting properties, storage properties, and the like may be improved.

In an implementation, the photosensitive resin composition may further include a silane coupling agent having a reactive substituent, e.g., a carboxyl group, a methacryloyl group, an isocyanate group, an epoxy group, or the like, to help improve its adherence to a substrate.

Examples of the silane coupling agent may include trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(epoxycyclohexyl)ethyltrimethoxysilane, and the like, and these may be used alone or in a mixture of two or more.

The silane coupling agent may be included in an amount of about 0.01 parts by weight to about 10 parts by weight, based on 100 parts by weight of the photosensitive resin composition. When the silane-coupling agent is included within the range, close-contacting properties, storing properties, and the like may be improved.

In an implementation, the photosensitive resin composition may further include a surfactant in order to improve coating properties and prevent a defect if desired.

Examples of the surfactant may include fluorine surfactants that are commercially available as BM-1000®, BM-1100®, and the like of BM Chemie Inc.; F 142D®, F 172®, F 173®, F 183®, F 554®, and the like of Dainippon Ink Kagaku Kogyo Co., Ltd.; FULORAD FC-135®, FC-170C®, FC-430®, FC-431®, and the like of Sumitomo 3M Co., Ltd.; SURFLON S-112®, S-113®, S-131®, S-141®, S-145®, and the like of ASAHI Glass Co., Ltd.; SH-28PA®, SH-190®, SH-193®, SZ-6032®, SF-8428®, and the like.

The surfactant may be included in an amount of about 0.001 parts by weight to about 5 parts by weight, based on 100 parts by weight of the photosensitive resin composition. When the surfactant is included within the range, the coating uniformity is secured, stains are not found, and the wetting property to the glass substrate is improved.

In an implementation, the photosensitive resin composition may further include other additives, e.g., an oxidization inhibitor, a stabilizer, or the like in a predetermined amount, unless properties are deteriorated.

According to another embodiment, a photosensitive resin layer manufactured using the photosensitive resin composition according to an embodiment is provided.

According to another embodiment, a color filter including the photosensitive resin layer is provided.

A pattern-forming process in the color filter may be as follows.

The process may include coating the photosensitive resin composition according to an embodiment on a support substrate in a method of spin coating, slit coating, inkjet printing, or the like; drying the coated positive photosensitive resin composition to form a photosensitive resin composition film; exposing the positive photosensitive resin composition film to light; developing the exposed positive photosensitive resin composition film in an alkali aqueous solution to obtain a photosensitive resin layer; and heat-treating the photosensitive resin layer.

Another embodiment provides a CMOS image sensor including the color filter.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS OF COMPOUNDS

Synthesis Example 1: Synthesis of Compound Represented by Chemical Formula A 2,4-dimethyldiphenylamine (10 mol), 1,2-epoxycyclohexane (12 mol), and sodium hydride (12 mol) were added to N,N-dimethyl formamide and then, heated at 90° C. and stirred for 24 hours. Subsequently, ethyl acetate was added to the solution and then, twice washed with water to extract an organic layer. The extracted organic layer was distilled under a reduced pressure and separated through column chromatography, obtaining Intermediate 1.

Intermediate 1 (10 mmol), iodomethane (15 mmol), and sodium hydride (15 mmol) were added to N,N-dimethyl formamide and then, stirred at ambient temperature for 24 hours. Subsequently, ethyl acetate was added to the solution and then, twice washed with water to extract an organic layer. The extracted organic layer was distilled under a reduced pressure and separated through column chromatography, obtaining Intermediate 2.

Intermediate 2 (60 mmol) and 3,4-dihydroxy-3-cyclobutyne-1,2-dione (30 mmol) were added to toluene (200 mL) and butanol (200 mL) and then, refluxed, and water produced therein was removed with a Dean-stark distillation apparatus. After stirring for 12 hours, the green reactant was distilled under a reduced pressure and purified through column chromatography, obtaining Intermediate 3.

Intermediate 3 (5 mmol) was dissolved in 600 mL of a chloroform solvent, and triethylamine (50 mmol) was added thereto. Subsequently, 2,6-pyridinedicarbonyl dichloride (20 mmol) and p-xylylenediamine (20 mmol) were dissolved in 60 mL of chloroform and simultaneously, added dropwise thereto at ambient temperature for 5 hours. After 12 hours, the obtained mixture was distilled under a reduced pressure and separated through column chromatography, obtaining a compound represented by Chemical Formula A.

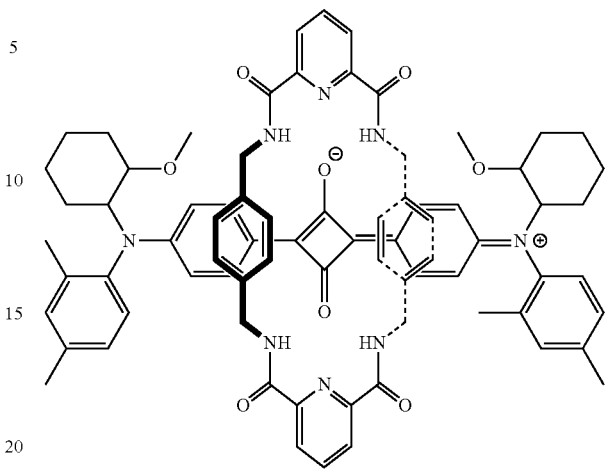

[Chemical Formula A]

Maldi-Tof Ms: 1230.59 m/z

Synthesis Example 2: Synthesis of Compound Represented by Chemical Formula B 2-[(4-bromophenoxy)methyl]oxirane (20 mmol), Pd(OAc)$_2$ (0.002 mmol), sodium t-butoxide (30 mmol), and cyclohexylamine (20 mmol) were added to a toluene solvent and then, stirred at ambient temperature for 30 minutes, and P(t-Bu)$_3$ (0.004 mmol) was added thereto and then, stirred at 110° C. for 15 hours. Subsequently, ethyl acetate was added to the solution and twice washed with water to extract an organic layer. The extracted organic layer was distilled under a reduced pressure and purified through column chromatography, obtaining Intermediate 4.

Intermediate 4 (20 mmol), Pd(OAc)$_2$ (0.002 mmol), sodium t-butoxide (30 mmol), and 1-bromobenzene (20 mmol) were added to a toluene solvent and then, stirred at ambient temperature for 30 minutes, and P(t-Bu)$_3$ (0.004 mmol) was added thereto and then, stirred at 110° C. for 15 hours. Subsequently, ethyl acetate was added to the solution and then, twice washed with water to extract an organic layer. The extracted organic layer was distilled under a reduced pressure and purified through column chromatography, obtaining Intermediate 5.

Intermediate 5 (60 mmol) and 3,4-dihydroxy-3-cyclobutyne-1,2-dione (30 mmol) were added to toluene (200 mL) and butanol (200 mL) and then, refluxed, and water produced therein was removed with a Dean-stark distillation apparatus. After stirring for 12 hours, the green reactant was distilled under a reduced pressure and purified through column chromatography, obtaining Intermediate 6.

Intermediate 6 (5 mmol) was dissolved in 600 mL of a chloroform solvent, and triethylamine (50 mmol) was added thereto. Then, 2,6-pyridinedicarbonyl dichloride (20 mmol) and p-xylylenediamine (20 mmol) were dissolved in 60 mL of chloroform and simultaneously, added dropwise thereto at ambient temperature for 5 hours. After 12 hours, the mixture was distilled under a reduced pressure and separated through column chromatography, obtaining a compound represented by Chemical Formula B.

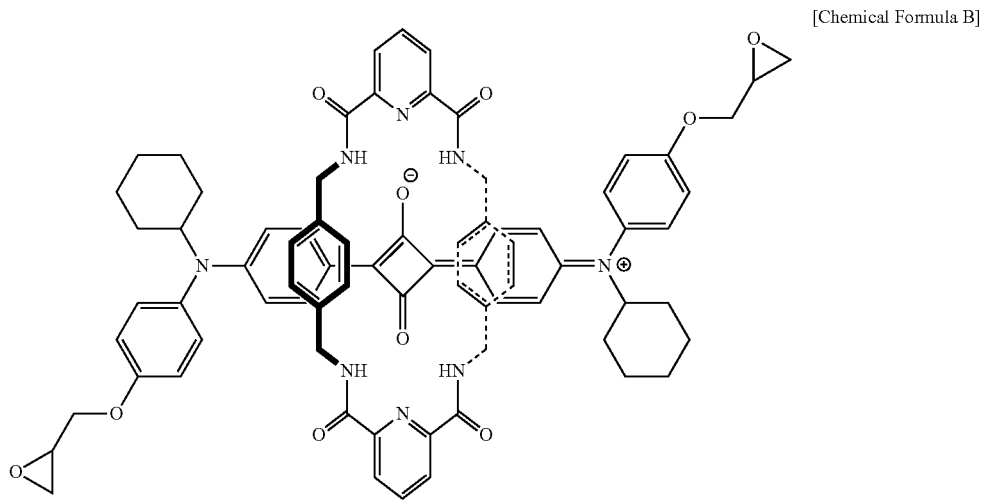

MALDI-TOF MS: 1259.5 m/z

Synthesis Example 3

After synthesizing a compound represented by the following formula C (Maldi-tof MS: 754.13 m/z), using the same method as in Synthesis Example 1 or Synthesis Example 2, the core (compound represented by the formula C)-shell (Compound represented by Formula 2-1) compound (Maldi-tof MS: 1286.78 m/z) was obtained.

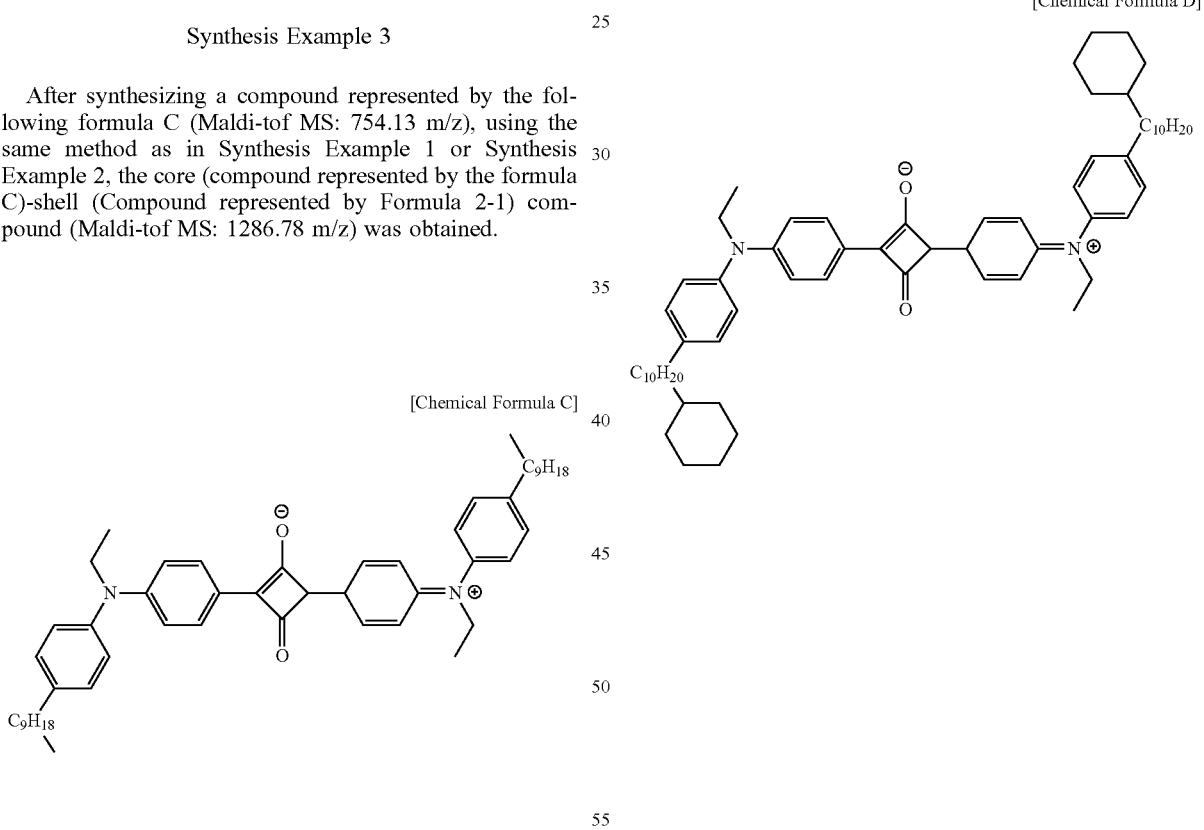

Synthesis Example 4

After synthesizing a compound represented by the following formula D (Maldi-tof MS: 890.37 m/z), using the same method as in Synthesis Example 1 or Synthesis Example 2, the core (compound represented by the formula D)-shell (Compound represented by Formula 2-1) compound (Maldi-tof MS: 1423.97 m/z) was obtained.

Synthesis Example 5

After synthesizing a compound represented by the following formula E (Maldi-tof MS: 638.89 m/z), using the same method as in Synthesis Example 1 or Synthesis Example 2, the core (compound represented by the formula E)-shell (Compound represented by Formula 2-1) compound (Maldi-tof MS: 1172.49 m/z) was obtained.

[Chemical Formula E]

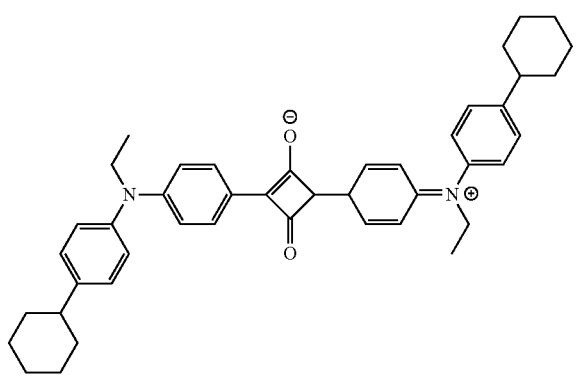

Synthesis Example 6

After synthesizing a compound represented by the following formula F (Maldi-tof MS: 727.09 m/z), using the same method as in Synthesis Example 1 or Synthesis Example 2, the core (compound represented by the formula F)-shell (Compound represented by Formula 2-1) compound (Maldi-tof MS: 1260.69 m/z) was obtained.

[Chemical Formula F]

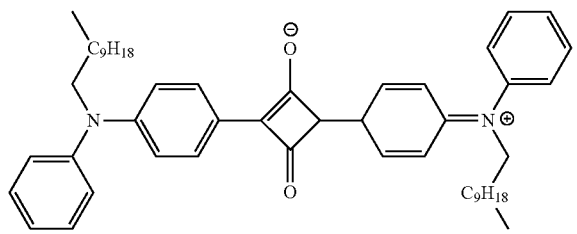

Synthesis Example 7

After synthesizing a compound represented by the following formula G (Maldi-tof MS: 863.32 m/z), using the same method as in Synthesis Example 1 or Synthesis Example 2, the core (compound represented by the formula G)-shell (Compound represented by Formula 2-1) compound (Maldi-tof MS: 1395.97 m/z) was obtained.

[Chemical Formula G]

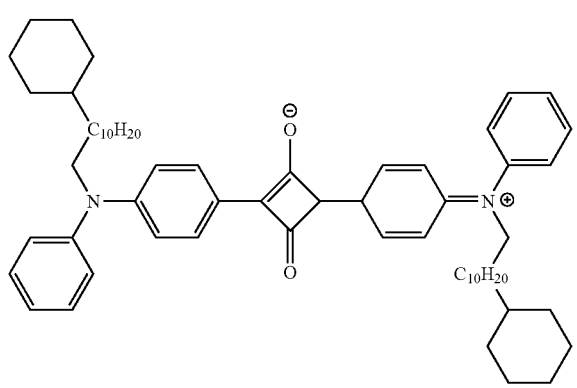

Synthesis Example 8

After synthesizing a compound represented by the following formula H (Maldi-tof MS: 610.84 m/z), using the same method as in Synthesis Example 1 or Synthesis Example 2, the core (compound represented by the formula H)-shell (Compound represented by Formula 2-1) compound (Maldi-tof MS: 1143.49 m/z) was obtained.

[Chemical Formula H]

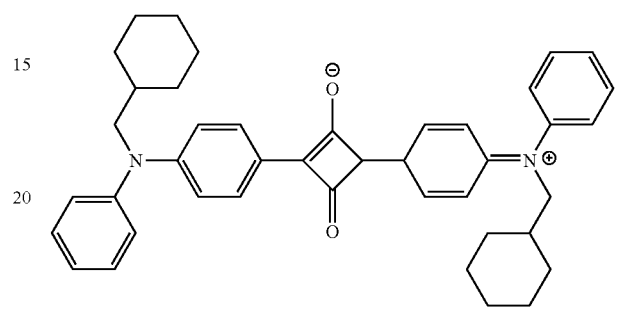

Synthesis Example 9

After synthesizing a compound represented by the following formula I (Maldi-tof MS: 775.13 m/z), using the same method as in Synthesis Example 1 or Synthesis Example 2, the core (compound represented by the formula I)-shell (Compound represented by Formula 2-1) compound (Maldi-tof MS: 1307.78 m/z) was obtained.

[Chemical Formula I]

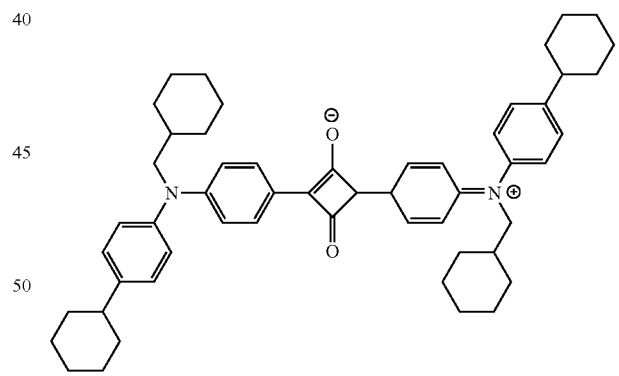

Synthesis Example 10

After synthesizing a compound represented by the following formula J (Maldi-tof MS: 1027.61 m/z), using the same method as in Synthesis Example 1 or Synthesis Example 2, the core (compound represented by the formula J)-shell (Compound represented by Formula 2-1) compound (Maldi-tof MS: 1561.21 m/z) was obtained.

[Chemical Formula J]

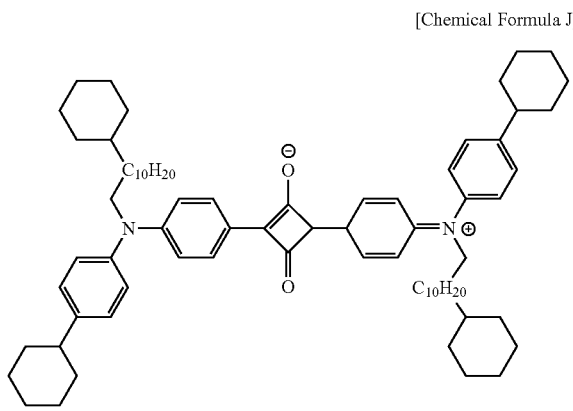

[Chemical Formula L]

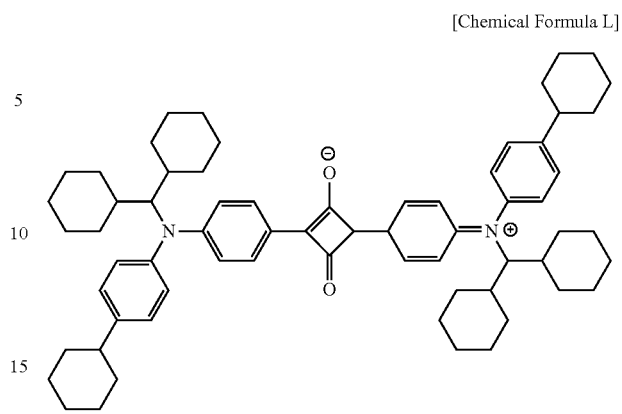

Synthesis Example 11

After synthesizing a compound represented by the following formula K (Maldi-tof MS: 1143.86 m/z), using the same method as in Synthesis Example 1 or Synthesis Example 2, the core (compound represented by the formula K)-shell (Compound represented by Formula 2-1) compound (Maldi-tof MS: 1676.51 m/z) was obtained.

Synthesis Example 13

After synthesizing a compound represented by the following formula M (Maldi-tof MS: 1205.93 m/z), using the same method as in Synthesis Example 1 or Synthesis Example 2, the core (compound represented by the formula M)-shell (Compound represented by Formula 2-1) compound (Maldi-tof MS: 1740.5 m/z) was obtained.

[Chemical Formula K]

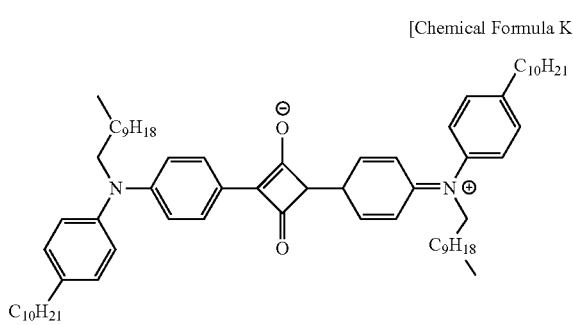

[Chemical Formula M]

Synthesis Example 12

After synthesizing a compound represented by the following formula L (Maldi-tof MS: 939.42 m/z), using the same method as in Synthesis Example 1 or Synthesis Example 2, the core (compound represented by the formula L)-shell (Compound represented by Formula 2-1) compound (Maldi-tof MS: 1473.99 m/z) was obtained.

Synthesis Example 14

After synthesizing a compound represented by the following formula N (Maldi-tof MS: 1288.16 m/z), using the same method as in Synthesis Example 1 or Synthesis Example 2, the core (compound represented by the formula N)-shell (Compound represented by Formula 2-1) compound (Maldi-tof MS: 1822.73 m/z) was obtained.

[Chemical Formula N]

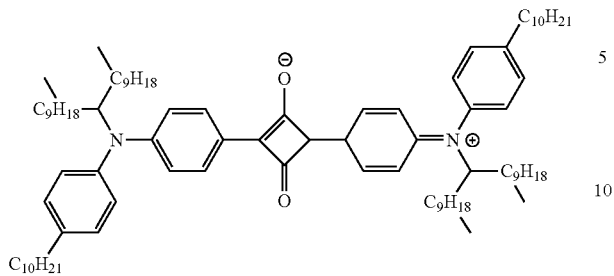

Comparative Synthesis Example 1: Synthesis of Compound Represented by Chemical Formula C-1

A compound represented by Chemical Formula C-1 was obtained in the same manner as in Synthesis Example 2, except that 2-aminoheptane was used instead of cyclohexylamine.

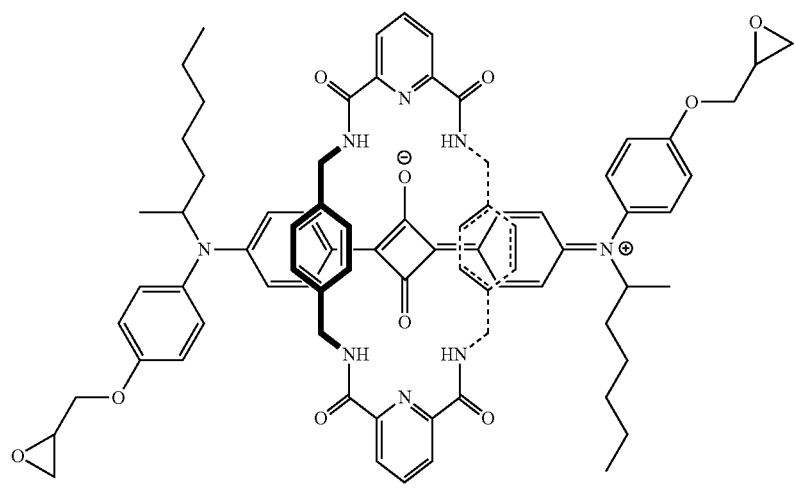

[Chemical Formula C-1]

MALDI-TOF MS: 1291.62 m/z

Comparative Synthesis Example 2: Synthesis of Compound Represented by Chemical Formula C-2

A compound represented by Chemical Formula C-2 was obtained in the same manner as in Synthesis Example 2, except that 4-bromophenyl acrylate was used instead of 2-[(4-bromophenoxy)methyl]oxirane.

[Chemical Formula C-2]

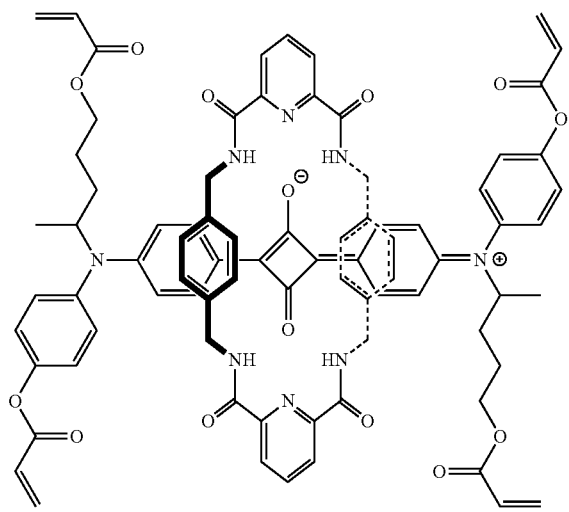

MALDI-TOF MS: 1370.52 m/z

Comparative Synthesis Example 3: Synthesis of Compound Represented by Chemical Formula C-3

(1-methylhexyl)-phenyl-p-tolyl-amine (100 mmol) and 3,4-dihydroxycyclobut-3-ene-1,2-dione (50 mmol) were added to toluene (300 mL) and butanol (300 mL) and refluxed, and water produced therein was removed with a Dean-stark distillation apparatus. After stirring for 12 hours, the reactant was distilled under a reduced pressure and purified through column chromatography, obtaining a squarylium compound. This compound (5 mmol) was dissolved in 600 mL of a chloroform solvent, and pyridine-2,6-dicarbonyl dichloride (20 mmol) and p-xylylenediamine (20 mmol) were dissolved in 60 mL of chloroform and then, added dropwise thereto at ambient temperature for 5 hours. After 12 hours, the mixture was distilled under a reduced pressure and separated through column chromatography, obtaining a compound represented by Chemical Formula C-3.

[Chemical Formula C-3]

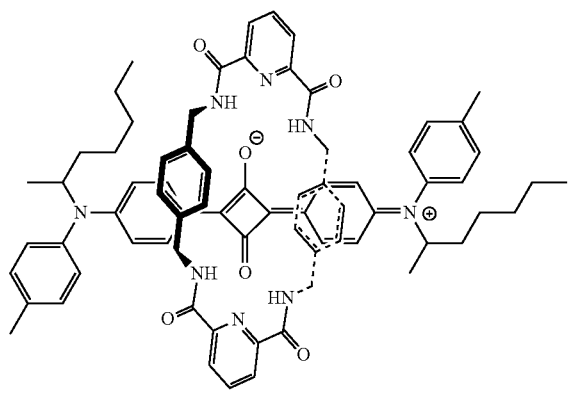

MALDI-TOF MS: 1175.5 m/z

Comparative Synthesis Example 4: Synthesis of Compound Represented by Chemical Formula C-4

Propionic acid 2-{(2-cyanoethyl)-[4-(2-hydroxy-3,4-dioxocyclobut-1-enyl)-phenyl]-amino}-ethyl ester (60 mmol), 1-(2-ethylhexyl)-1H-indole (60 mmol) were added to toluene (200 mL) and butanol (200 mL) and then, refluxed, and water produced therein was removed with a Dean-stark distillation apparatus. A green reactant therefrom was stirred for 12 hours, distilled under a reduced pressure, and purified through column chromatography, obtaining an asymmetric squarylium compound. This compound (5 mmol) was dissolved in 600 mL of a chloroform solvent, and then, pyridine-2,6-dicarbonyl dichloride (20 mmol) and p-xylylene diamine (20 mmol) were dissolved in 60 mL of chloroform and simultaneously added dropwise thereto at ambient temperature for 5 hours. After 12 hours, the obtained mixture was distilled under a reduced pressure and separated through column chromatography, obtaining a compound represented by Chemical Formula C-4.

[Chemical Formula C-4]

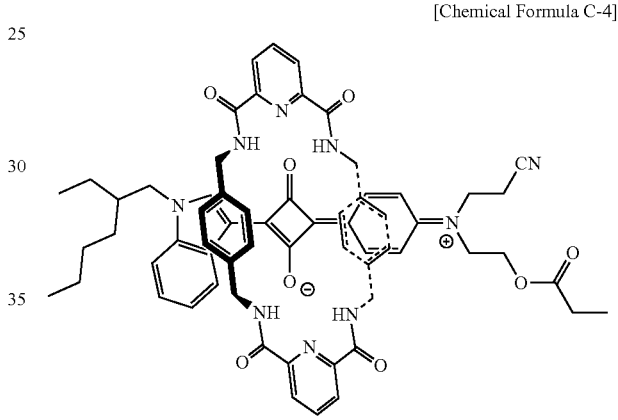

MALDI-TOF MS: 1088.48 m/z

Synthesis of Photosensitive Resin Composition

Example 1

The following components were mixed in each composition shown in Table 1 to prepare a photosensitive resin composition according to Example 1.

Specifically, a photopolymerization initiator was dissolved in a solvent, the solution was stirred at ambient temperature for 2 hours, a binder resin and a photopolymerizable monomer were added thereto, and the obtained mixture was stirred at ambient temperature for 2 hours. Subsequently, the compound (represented by Chemical Formula A) according to Synthesis Example 1 as a colorant was added thereto and then, stirred for 1 hour at ambient temperature. Then, the product was filtered three times to remove impurities and prepare a photosensitive resin composition.

TABLE 1

(unit: wt %)

| | | Raw materials | Amount |
|---|---|---|---|
| Colorant | Dye | Compound A of Synthesis Example 1 | 40 |
| | Pigment dispersion | C.I. pigment yellow 185 (SKC) | 30 |
| Binder resin | | RY 102 (Showadenko) | 2.8 |
| Photopolymerizable monomer | | Dipentaerythritol hexacrylate (DPHA) | 1.8 |
| Photopolymerization initiator | | 1,2-octandione | 0.3 |
| Solvent | | PGMEA (Propylene Glycol Monomethyl Ether Acetate) | 25 |
| Other additives | | F-554 (leveling agent, DIC) | 0.1 |
| Total | | | 100.00 |

Example 2

A photosensitive resin composition was prepared according to the same method as Example 1 except that the compound (represented by Chemical Formula B) according to Synthesis Example 2 was used instead of the compound (represented by Chemical Formula A) according to Synthesis Example 1.

Example 3

A photosensitive resin composition was prepared according to the same method as Example 1 except that the core-shell compound according to Synthesis Example 3 was used instead of the compound (represented by Chemical Formula A) according to Synthesis Example 1.

Example 4

A photosensitive resin composition was prepared according to the same method as Example 1 except that the core-shell compound according to Synthesis Example 4 was used instead of the compound (represented by Chemical Formula A) according to Synthesis Example 1.

Example 5

A photosensitive resin composition was prepared according to the same method as Example 1 except that the core-shell compound according to Synthesis Example 5 was used instead of the compound (represented by Chemical Formula A) according to Synthesis Example 1.

Example 6

A photosensitive resin composition was prepared according to the same method as Example 1 except that the core-shell compound according to Synthesis Example 6 was used instead of the compound (represented by Chemical Formula A) according to Synthesis Example 1.

Example 7

A photosensitive resin composition was prepared according to the same method as Example 1 except that the core-shell compound according to Synthesis Example 7 was used instead of the compound (represented by Chemical Formula A) according to Synthesis Example 1.

Example 8

A photosensitive resin composition was prepared according to the same method as Example 1 except that the core-shell compound according to Synthesis Example 8 was used instead of the compound (represented by Chemical Formula A) according to Synthesis Example 1.

Example 9

A photosensitive resin composition was prepared according to the same method as Example 1 except that the core-shell compound according to Synthesis Example 9 was used instead of the compound (represented by Chemical Formula A) according to Synthesis Example 1.

Example 10

A photosensitive resin composition was prepared according to the same method as Example 1 except that the core-shell compound according to Synthesis Example 10 was used instead of the compound (represented by Chemical Formula A) according to Synthesis Example 1.

Example 11

A photosensitive resin composition was prepared according to the same method as Example 1 except that the core-shell compound according to Synthesis Example 11 was used instead of the compound (represented by Chemical Formula A) according to Synthesis Example 1.

Example 12

A photosensitive resin composition was prepared according to the same method as Example 1 except that the core-shell compound according to Synthesis Example 12 was used instead of the compound (represented by Chemical Formula A) according to Synthesis Example 1.

Example 13

A photosensitive resin composition was prepared according to the same method as Example 1 except that the core-shell compound according to Synthesis Example 13 was used instead of the compound (represented by Chemical Formula A) according to Synthesis Example 1.

Example 14

A photosensitive resin composition was prepared according to the same method as Example 1 except that the core-shell compound according to Synthesis Example 14 was used instead of the compound (represented by Chemical Formula A) according to Synthesis Example 1.

Comparative Example 1

A photosensitive resin composition was prepared according to the same method as Example 1 except that the compound (represented by Chemical Formula C-1) according to Comparative Synthesis Example 1 was used instead of the compound (represented by Chemical Formula A) according to Synthesis Example 1.

Comparative Example 2

A photosensitive resin composition was prepared according to the same method as Example 1 except that the compound (represented by Chemical Formula C-2) according to Comparative Synthesis Example 2 was used instead of the compound (represented by Chemical Formula A) according to Synthesis Example 1.

Comparative Example 3

A photosensitive resin composition was prepared according to the same method as Example 1 except that the compound (represented by Chemical Formula C-3) according to Comparative Synthesis Example 3 was used instead of the compound (represented by Chemical Formula A) according to Synthesis Example 1.

Comparative Example 4

A photosensitive resin composition was prepared according to the same method as Example 1 except that the compound (represented by Chemical Formula C-4) according to Comparative Synthesis Example 4 was used instead of the compound (represented by Chemical Formula A) according to Synthesis Example 1.

Evaluation 1: Measurement of Chemical Resistance of Composition

Each color filter specimen prepared by using the photosensitive resin compositions according to Examples 1 to 14 and Comparative Examples 1 to 4 was immersed in a PGMEA solution for 10 minutes to evaluate whether remaining patterns thereof were peeled off. When patterns were not peeled off and remained, "O" was given, and when at least one of the patterns was peeled off, "X" was given, and the results are shown in Table 2 and FIG. 1. FIG. 1 is an image showing a color filter specimen after immersing the color filter specimen prepared by using a composition including the compound according to Example 1 as a dye in a PGMEA solution for 10 minutes.

TABLE 2

|  | Pattern peeling |
|---|---|
| Example 1 | O |
| Example 2 | O |
| Example 3 | O |
| Example 4 | O |
| Example 5 | O |
| Example 6 | O |
| Example 7 | O |
| Example 8 | O |
| Example 9 | O |
| Example 10 | O |
| Example 11 | O |
| Example 12 | O |
| Example 13 | O |
| Example 14 | O |
| Comparative Example 1 | X |
| Comparative Example 2 | X |
| Comparative Example 3 | X |
| Comparative Example 4 | X |

Referring to Table 2, the photosensitive resin compositions of Examples 1 and 2 (including the core-shell compound according to one embodiment in a high content) exhibited excellent chemical resistance and turned out to be appropriately used for a CMOS image sensor.

Evaluation 2: Measurement of Coloring Power of Compositions

The photosensitive resin compositions of Examples 1 to 14 and Comparative Examples 1 to 4 at a thin film thickness of 0.3 μm were evaluated with respect to coloring power by measuring a color with a spectrophotometer. Specifically, the coloring power was evaluated by transmittance at a wavelength of 650 nm, and the results are shown in Table 3.

TABLE 3

(unit: %)

|  | Transmittance |
|---|---|
| Example 1 | 2.8 |
| Example 2 | 2.9 |
| Example 3 | 2.8 |
| Example 4 | 2.8 |
| Example 5 | 2.7 |
| Example 6 | 2.8 |
| Example 7 | 2.7 |
| Example 8 | 2.9 |
| Example 9 | 2.8 |
| Example 10 | 2.8 |
| Example 11 | 2.9 |
| Example 12 | 2.9 |
| Example 13 | 2.9 |
| Example 14 | 2.8 |
| Comparative Example 1 | 3.1 |
| Comparative Example 2 | 3.0 |
| Comparative Example 3 | 3.0 |
| Comparative Example 4 | 3.1 |

Referring to Table 3, the compound according to one embodiment as a green dye exhibited almost similar coloring power to the compounds according to the comparative examples as a green dye at a thin film thickness of 0.3 μm.

By way of summation and review, the CMOS image sensor is developed along a technology trend of increasing the number of pixels and decreasing a size for realizing high-definition and down-sizing a device. As the pixels become smaller, there may be a limit to manufacture a fine pattern by using a pigment, and accordingly, a dye for compensating for this may be considered. However, the dye may have issues in terms of processibility during the pattern manufacture, compared with the pigment. For example, the dye may have issues in terms of chemical resistance, because the pigment is fine particles and has crystallinity and thus insufficient solubility and thereby is not eluted in a solvent such as PGMEA after the baking, but the dye is an amorphous solid and thus dissolved out in the solvent after the baking. The CMOS image sensor may use a high content of a colorant and thus a binder resin or a monomer at a relatively lower ratio, and the chemical resistance of the dye may be difficult to improve.

One or more embodiments may provide a core-shell compound constituting a

The core-shell compound according to an embodiment may have excellent chemical resistance by itself, and thus may maintain improved chemical resistance even after curing and thermal processes, and thus the photosensitive resin composition including this as a dye may form a fine pattern, thereby providing a green color filter for a CMOS image sensor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A core-shell compound comprising a core represented by Chemical Formula 1 and a shell surrounding the core, the shell being represented by Chemical Formula 2:

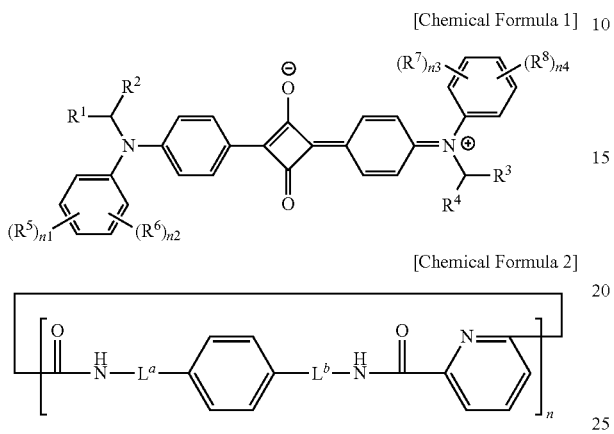

[Chemical Formula 1]

[Chemical Formula 2]

wherein, in Chemical Formula 1 and Chemical Formula 2,
$R^1$ to $R^8$ are each independently a hydrogen atom, a substituted or unsubstituted C1 to C20 alkyl group, a substituted or unsubstituted C3 to C20 cycloalkyl group, or a substituted or unsubstituted C1 to C20 alkoxy group, provided that $R^1$ to $R^8$ are not all simultaneously a hydrogen atom,
$R^1$ and $R^2$ may be fused to each other to form a fused ring,
$R^3$ and $R^4$ may be fused to each other to form a fused ring,
at least one of $R^1$, $R^2$, $R^5$, and $R^6$ includes a substituted or unsubstituted C10 to C20 alkyl group or a substituted or unsubstituted C3 to C20 cycloalkyl group,
at least one of $R^3$, $R^4$, $R^7$, and $R^8$ includes a substituted or unsubstituted C10 to C20 alkyl group or a substituted or unsubstituted C3 to C20 cycloalkyl group,
at least one of $R^1$, $R^2$, $R^5$, and $R^6$ is a C10 to C20 alkyl group substituted with a cyclohexyl group at a terminal end thereof,
at least one of $R^3$, $R^4$, $R^7$, and $R^8$ is a C10 to C20 alkyl group substituted with a cyclohexyl group at a terminal end thereof,
$L^a$ and $L^b$ are each independently a single bond or a substituted or unsubstituted C1 to C10 alkylene group,
n1, n2, n3, and n4 are each independently an integer of 0 to 5, 1≤n1+n2≤3, 1≤n3+n4≤3, and
n is an integer greater than or equal to 2.

2. The core-shell compound as claimed in claim 1, wherein:
at least one of $R^1$ to $R^8$ includes a substituted or unsubstituted C3 to C20 cycloalkyl group, and
the substituted or unsubstituted C3 to C20 cycloalkyl group is a substituted or unsubstituted cyclohexyl group.

3. The core-shell compound as claimed in claim 1, wherein:
at least one of $R^1$, $R^2$, $R^5$, and $R^6$ includes a substituted or unsubstituted C3 to C20 cycloalkyl group at a terminal end thereof, and
at least one of $R^3$, $R^4$, $R^7$, and $R^8$ includes a substituted or unsubstituted C3 to C20 cycloalkyl group at a terminal end thereof.

4. The core-shell compound as claimed in claim 1, wherein:
$R^5$ and $R^6$ are different from each other, and
$R^7$ and $R^8$ are different from each other.

5. The core-shell compound as claimed in claim 1, wherein:
two of $R^1$, $R^2$, $R^5$, and $R^6$ are each independently an unsubstituted C10 to C20 alkyl group, a C10 to C20 alkyl group substituted with a cyclohexyl group at a terminal end thereof, or a substituted or unsubstituted cyclohexyl group, and
two of $R^3$, $R^4$, $R^7$, and $R^8$ are each independently an unsubstituted C10 to C20 alkyl group, a C10 to C20 alkyl group substituted with a cyclohexyl group at a terminal end thereof, or a substituted or unsubstituted cyclohexyl group.

6. The core-shell compound as claimed in claim 1, wherein:
three of $R^1$, $R^2$, $R^5$, and $R^6$ are each independently an unsubstituted C10 to C20 alkyl group, a C10 to C20 alkyl group substituted with a cyclohexyl group at a terminal end thereof, or a substituted or unsubstituted cyclohexyl group, and
three of $R^3$, $R^4$, $R^7$, and $R^8$ are each independently an unsubstituted C10 to C20 alkyl group, a C10 to C20 alkyl group substituted with a cyclohexyl group at a terminal end thereof, or a substituted or unsubstituted cyclohexyl group.

7. The core-shell compound as claimed in claim 1, wherein:
Chemical Formula 1 is represented by Chemical Formula 1-1:

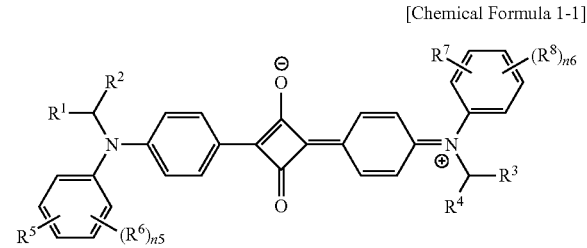

[Chemical Formula 1-1]

in Chemical Formula 1-1,
$R^1$ to $R^4$, $R^6$, and $R^8$ are each independently a hydrogen atom, a substituted or unsubstituted C1 to C20 alkyl group, a substituted or unsubstituted cyclohexyl group, or a substituted or unsubstituted C1 to C20 alkoxy group, provided that $R^1$ to $R^4$, $R^6$, and $R^8$ are not all simultaneously a hydrogen atom,
$R^1$ and $R^2$ may be fused to each other to form a fused ring,
$R^3$ and $R^4$ may be fused to each other to form a fused ring,
$R^5$ and $R^7$ are each, a C10 to C20 alkyl group substituted with a cyclohexyl group at a terminal end thereof, and
n5 and n6 are each independently an integer of 0 to 2.

8. The core-shell compound as claimed in claim 1, wherein:
Chemical Formula 1 is represented by Chemical Formula 1-2:

[Chemical Formula 1-2]

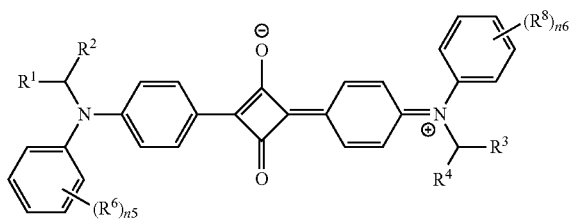

in Chemical Formula 1-2, $R^2$, $R^4$, $R^6$, and $R^8$ are each independently a hydrogen atom, a substituted or unsubstituted C1 to C20 alkyl group, a substituted or unsubstituted cyclohexyl group, or a substituted or unsubstituted C1 to C20 alkoxy group, provided that $R^2$, $R^4$, $R^6$, and $R^8$ are not all simultaneously a hydrogen atom, $R^1$ and $R^2$ may be fused to each other to form a fused ring, $R^3$ and $R^4$ may be fused to each other to form a fused ring, $R^1$ and $R^3$ are each a C10 to C20 alkyl group substituted with a cyclohexyl group at a terminal end thereof, and n5 and n6 are each independently an integer of 0 to 2.

9. The core-shell compound as claimed in claim 5, wherein:

Chemical Formula 1 is represented by Chemical Formula 1-3:

[Chemical Formula 1-3]

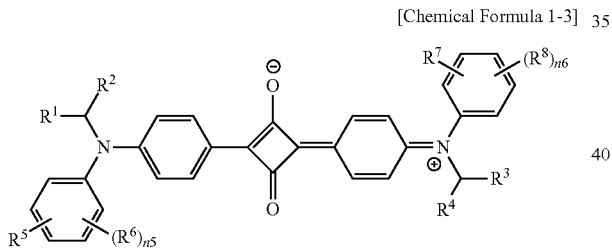

in Chemical Formula 1-3, $R^2$, $R^4$, $R^6$, and $R^8$ are each independently a hydrogen atom, a substituted or unsubstituted C1 to C20 alkyl group, a substituted or unsubstituted cyclohexyl group, or a substituted or unsubstituted C1 to C20 alkoxy group, provided that $R^2$, $R^4$, $R^6$, and $R^8$ are not all simultaneously a hydrogen atom, $R^1$ and $R^2$ may be fused to each other to form a fused ring, $R^3$ and $R^4$ may be fused to each other to form a fused ring, $R^1$, $R^3$, $R^5$, and $R^7$ are each independently an unsubstituted C10 to C20 alkyl group, a C10 to C20 alkyl group substituted with a cyclohexyl group at a terminal end thereof, or a substituted or unsubstituted cyclohexyl group, and n5 and n6 are each independently an integer of 0 to 2.

10. The core-shell compound as claimed in claim 6, wherein:

Chemical Formula 1 is represented by Chemical Formula 1-4:

[Chemical Formula 1-4]

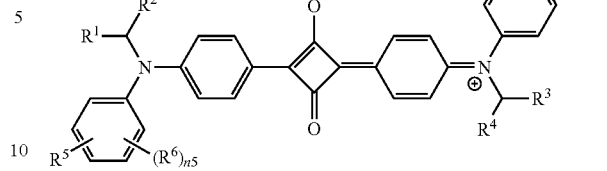

in Chemical Formula 1-4, $R^6$ and $R^8$ are each independently a hydrogen atom, a substituted or unsubstituted C1 to C20 alkyl group, a substituted or unsubstituted cyclohexyl group, or a substituted or unsubstituted C1 to C20 alkoxy group, $R^1$ and $R^2$ may be fused to each other to form a fused ring, $R^3$ and $R^4$ may be fused to each other to form a fused ring, $R^1$ to $R^5$ and $R^7$ are each independently an unsubstituted C10 to C20 alkyl group, a C10 to C20 alkyl group substituted with a cyclohexyl group at a terminal end thereof, or a substituted or unsubstituted cyclohexyl group, and n5 and n6 are each independently an integer of 0 to 2.

11. The core-shell compound as claimed in claim 1, wherein the core represented by Chemical Formula 1 has a maximum absorption wavelength at about 610 nm to about 640 nm.

12. The core-shell compound as claimed in claim 1, wherein the shell represented by Chemical Formula 2 is represented by Chemical Formula 2-1:

[Chemical Formula 2-1]

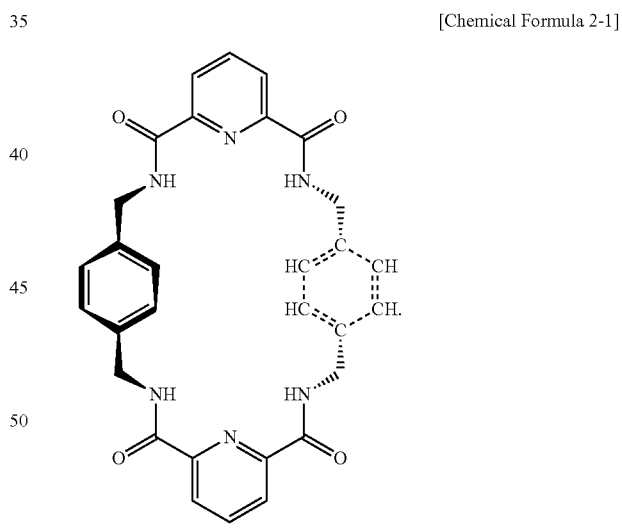

13. The core-shell compound as claimed in claim 1, wherein the core-shell compound is a green dye.

14. A photosensitive resin composition comprising the core-shell compound as claimed in claim 1.

15. The photosensitive resin composition as claimed in claim 14, further comprising a binder resin, a photopolymerizable monomer, a photopolymerization initiator, and a solvent.

16. A CMOS image sensor comprising the photosensitive resin composition as claimed in claim 14.

17. A photosensitive resin layer manufactured using the photosensitive resin composition as claimed in claim 14.

18. A color filter comprising the photosensitive resin layer as claimed in claim 17.

19. A CMOS image sensor comprising the color filter as claimed in claim 18.

* * * * *